United States Patent
Ohmi et al.

(10) Patent No.: US 7,097,735 B2
(45) Date of Patent: Aug. 29, 2006

(54) PLASMA PROCESSING DEVICE

(75) Inventors: Tadahiro Ohmi, Sendai (JP); Masaki Hirayama, Sendai (JP); Shigetoshi Sugawa, Sendai (JP); Tetsuya Goto, Sendai (JP)

(73) Assignees: Tadahiro Ohmi, Miyagi (JP); Tokyo Electron Limited, Tokyo (JP)

( * ) Notice: Subject to any disclaimer, the term of this patent is extended or adjusted under 35 U.S.C. 154(b) by 239 days.

(21) Appl. No.: 10/296,614

(22) PCT Filed: Mar. 28, 2002

(86) PCT No.: PCT/JP02/03110

§ 371 (c)(1),
(2), (4) Date: Nov. 26, 2002

(87) PCT Pub. No.: WO02/080251

PCT Pub. Date: Oct. 10, 2002

(65) Prior Publication Data

US 2004/0050494 A1    Mar. 18, 2004

(30) Foreign Application Priority Data

Mar. 28, 2001    (JP)    ................................ 2001-94273

(51) Int. Cl.
*H01L 21/306*    (2006.01)
*C23C 16/00*    (2006.01)

(52) U.S. Cl. .................... 156/345.41; 118/723 MW

(58) Field of Classification Search ....... 118/723 MW, 118/723 ME, 723 MA, 723 MR; 156/345.41, 156/345.42, 345.36; 315/111.21, 111.51
See application file for complete search history.

(56) References Cited

U.S. PATENT DOCUMENTS

| | | | | | |
|---|---|---|---|---|---|
| 4,883,686 | A | * | 11/1989 | Doehler et al. | ............. 427/562 |
| 5,248,370 | A | * | 9/1993 | Tsui et al. | ............. 156/345.26 |
| 5,342,472 | A | * | 8/1994 | Imahashi et al. | ...... 156/345.42 |
| 6,059,922 | A | | 5/2000 | Yamazaki et al. | |
| 6,322,662 | B1 | * | 11/2001 | Ishii et al. | ............. 156/345.41 |
| 6,357,385 | B1 | * | 3/2002 | Ohmi et al. | .......... 118/723 AN |
| 6,388,632 | B1 | * | 5/2002 | Murakawa et al. | ......... 343/770 |
| 6,736,930 | B1 | * | 5/2004 | Hongoh | ................. 156/345.41 |
| 2001/0050059 | A1 | | 12/2001 | Hongo et al. | |

FOREIGN PATENT DOCUMENTS

| | | |
|---|---|---|
| JP | 09-063793 A | 3/1997 |
| JP | 2000-223298 A | 8/2000 |
| JP | 2000-277508 A | 10/2000 |
| WO | WO 00/74127 A1 | 12/2000 |

* cited by examiner

*Primary Examiner*—Luz Alejandro-Mulero
(74) *Attorney, Agent, or Firm*—Finnegan, Henderson, Farabow, Garrett & Dunner, L.L.P.

(57) ABSTRACT

In a microwave plasma processing apparatus that uses a radial line slot antenna, the efficiency of cooling of a shower plate is optimized and simultaneously the efficiency of microwave excitation is optimized, by causing a radiation surface of the radial line slot antenna to make an intimate contact with a cover plate that forms a part of an outer wall of the processing chamber and makes an intimate contact with the shower plate.

58 Claims, 16 Drawing Sheets

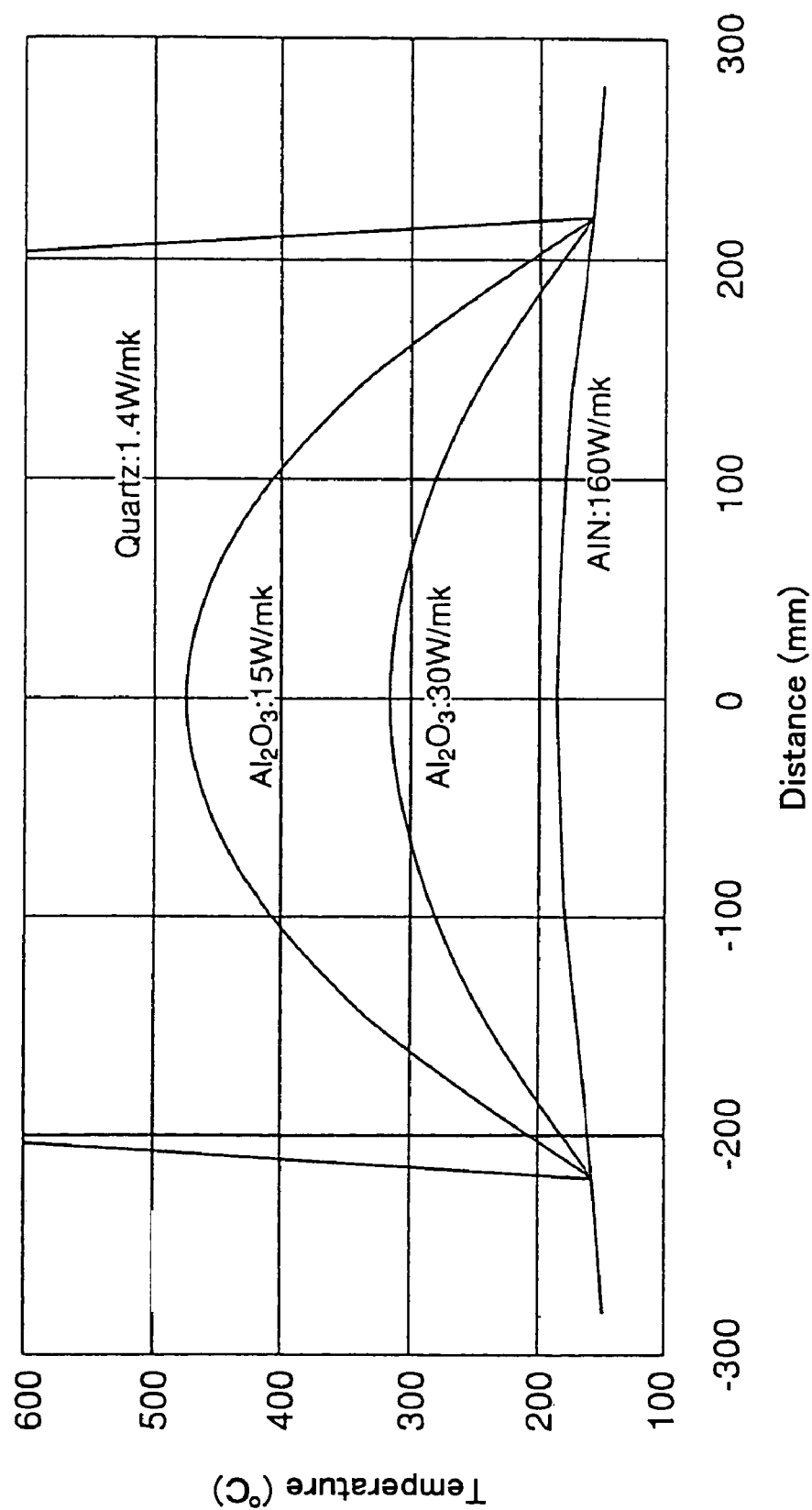

PLASMA PROCESSING DEVICE

CROSS REFERENCE TO RELATED APPLICATIONS

This application is a national phase application based on international application number PCT/JP02/03110, filed on Mar. 28, 2002, and claims the priority of Japanese Patent Application No. 2001-084273, filed on Mar. 28, 2001.

TECHNICAL FIELD

The present invention generally relates to plasma processing apparatuses and more particularly to a microwave plasma processing apparatus.

Plasma process and plasma processing apparatus are indispensable technology for fabricating ultrafine semiconductor devices of these days called deep submicron devices or deep subquarter micron devices characterized by a gate length of near 0.1 µm or less, or for fabricating ultra high-resolution flat-panel display devices including liquid crystal display devices.

Conventionally, various plasma excitation methods have been used in plasma processing apparatuses used for fabrication of semiconductor devices or liquid crystal display devices. Particularly, a parallel-plate type high-frequency excitation plasma processing apparatus or an induction-coupled plasma processing apparatus are used commonly. However, such conventional plasma processing apparatuses have a drawback of non-uniform plasma formation in that the region of high electron density is limited, and it has been difficult to conduct a uniform process over the entire substrate surface with large processing rate, and hence with large throughput. This problem becomes particularly acute when processing a large diameter substrate. Further, such a conventional plasma processing device has several inherent problems, associated with its high electron temperature, in that the semiconductor devices formed on the substrate undergo damaging and that significant metal contamination is caused as a result of sputtering of a chamber wall. Thus, there are increasing difficulties in such conventional plasma processing apparatuses to meet for the stringent demand of further device miniaturization and further improvement of productivity of semiconductor devices or liquid crystal display devices.

Meanwhile, there are proposals of a microwave plasma processing apparatus that uses high-density plasma excited by a microwave electric field, in place of a direct-current magnetic field. For example, there is a proposal of a plasma processing apparatus that causes excitation of plasma by radiating a microwave into a processing vessel from a planar antenna (radial line slot antenna) having a number of slots disposed so as to form a uniform microwave, such that the microwave electric field causes ionization of a gas in a vacuum vessel. (See for example Japanese Laid-Open Patent Application 9-63793). In the microwave plasma thus excited, it is possible to realize a high plasma density over a wide area right underneath the antenna, and it becomes possible to conduct uniform plasma processing in a short duration. The microwave plasma thus formed is characterized by low electron temperature, and damaging or metal contamination of the substrate is avoided. Further, it is possible to form uniform plasma over a large surface area, and it can be easily applied to the fabrication process of a semiconductor device using a large diameter semiconductor substrate or large size liquid crystal display device.

BACKGROUND ART

FIGS. 1A and 1B show the construction of a conventional microwave plasma processing apparatus 100 having such a radial line slot antenna, wherein FIG. 1A shows the microwave plasmas processing apparatus in a cross-sectional view while FIG. 1B shows the construction of the radial line slot antenna.

Referring to FIG. 1A, the microwave plasma processing apparatus 100 has a processing chamber 101 evacuated from plural evacuation ports 116, and there is formed a stage 115 for holding a substrate 114 to be processed. In order to realize uniform processing in the processing chamber 101, a ring-shaped space 101A is formed around the stage 115, and the plural evacuation ports 116 are formed in communication with the foregoing space 101A with a uniform interval, and hence in axial symmetry with regard to the substrate. Thereby, it becomes possible to evacuate the processing chamber 101 uniformly through the space 101A and the evacuation ports 116.

On the processing chamber 101, there is formed a plate 103 of plate-like form at the location corresponding to the substrate 114 on the stage 115 as a part of the outer wall of the processing chamber 101 via a seal ring 109, wherein the shower plate 103 is formed of a dielectric material of small loss and includes a large number of apertures 107. Further, a cover plate 102 also of a dielectric material of small loss is provided on the outer side of the shower plate 103 via another seal ring 108.

The shower plate 103 is formed with a passage 104 of a plasma gas on the top surface thereof, and each of the plural apertures 107 are formed in communication with the foregoing plasma gas passage 104. Further, there is formed a plasma gas supply passage 106 in the interior of the shower plate 103 in communication with a plasma gas supply port 105 provided on the outer wall of the processing vessel 101. Thus, the plasma gas of Ar, Kr or the like supplied to the foregoing plasma gas supply port 105 is supplied to the foregoing apertures 107 from the supply passage 106 via the passage 104 and is released into a space 103B right underneath the shower plate 103 in the processing vessel 101 from the apertures 107 with substantially uniform concentration.

On the processing vessel 101, there is provided a radial line slot antenna 110 having a radiation surface shown in FIG. 1B on the outer side of the cover plate 102 with a separation of 4–5 mm from the cover plate 102. The radial line slot antenna 110 is connected to an external microwave source (not shown) via a coaxial waveguide 110A and causes excitation of the plasma gas released into the space 101B by the microwave from the microwave source. It should be noted that the gap between the cover plate 102 and the radiation surface of the radial line slot antenna 110 is filled with the air.

The radial line slot antenna 110 is formed of a flat disk-like antenna body 110B connected to an outer waveguide of the coaxial waveguide 110A and a radiation plate 110C is provided on the mouth of the antenna body 110B, wherein the radiation plate 110C is formed with a number of slots 110a and slots 110b wherein slots 110b are formed in a direction crossing the slots 110a perpendicularly as represented in FIG. 1B. Further, a retardation plate 110D of a dielectric film of uniform thickness is inserted between the antenna body 110B and the radiation plate 11C.

In the radial line slot antenna 110 of such a construction, the microwave supplied from the coaxial waveguide 110 spreads between the disk-like antenna body 110B and the radiation plate 110C as it is propagated in the radial direction, wherein there occurs a compression of wavelength as a result of the action of the retardation plate 110D. Thus, by forming the slots 110a and 110b in concentric relationship in correspondence to the wavelength of the radially propagating microwave so as to cross perpendicularly with each other, it becomes possible to emit a plane wave having a circular polarization state in a direction substantially perpendicular to the radiation plate 110C.

By using such a radial line slot antenna 110, uniform plasma is formed in the space 101B right underneath the shower plate 103. The high-density plasma thus formed is characterized by a low electron temperature and thus, there is caused no damaging of the substrate 114 and there is caused no metal contamination as a result of the sputtering of the vessel wall of the processing vessel 101.

In the plasma processing apparatus of FIG. 1, it should further be noted that there is provided a conductive structure 111 in the processing vessel 101 between the shower plate 103 and the substrate 114, wherein the conductive structure is formed with a number of nozzles 113 supplied with a processing gas from an external processing gas source (not shown) via a processing gas passage 112 formed in the processing vessel 101, and each of the nozzles 113 releases the processing gas supplied thereto into a space 101C between the conductive structure 111 and the substrate 114. It should be noted that the conductive structure 111 is formed with openings between adjacent nozzles 113 with a size such that the plasma formed in the space 101B passes efficiently from the space 101B to the space 101C by way of diffusion.

Thus, in the case a processing gas is released into the space 101C from the conductive structure 111 via the nozzles 113, the processing gas is excited by the high-density plasma formed in the space 101B and a uniform plasma processing is conducted on the substrate 114 efficiently and with high rate, without damaging the substrate or the devices on the substrate, and without contaminating the substrate. Further, it should be noted that the microwave emitted from the radial line slot antenna is blocked by the conductive structure and there is no possibility of such a microwave causes damaging in the substrate 114.

Meanwhile, the density of the plasma formed in the space 101B can reach the order of $10^{12}/cm^3$ in such a plasma processing apparatus 110 that uses the radial line slot antenna 110. Thus, the shower plate 103 is exposed to a large amount of ions and electrons constituting the high-density plasma, and the ions and electrons thus formed cause heating. The thermal flux caused by such ions and electrons can reach the value of as much as 1–2 W/cm². In view of the fact that the plasma processing apparatus 100 is frequently operated by maintaining the wall temperature of the processing chamber 101 to about 150° C. so as to suppress formation of deposits on the processing chamber 101, there is caused accumulation of heat in the shower plate 103 and the cover plate 102 formed of a dielectric material, as a result of heating of the processing chamber 101. As a result, there is formed a very large temperature distribution.

FIG. 2 shows the temperature distribution formed in the shower plate 103 for the case the wall temperature of the processing chamber 101 is set to 150° C. and the heat of the high-density plasma formed in the space 101B has been transferred into the shower plate 103 with a flux of 1 W/cm². Here, the thickness of the shower plate 103 is set to 25 mm.

Referring to FIG. 2, it can be seen that the temperature at the central part of the shower plate exceeds far beyond 600° C. in the case a quartz glass having thermal conductivity of 1.4 W/m·K is used for the shower plate 103. In view of the large thermal strain associated with the temperature difference, it is concluded that such a shower plate is not suitable for practical use. In the case the shower plate is formed of $Al_2O_3$ having thermal conductivity of 1.5 W/m·K, or in the case of an $Al_2O_3$ shower plate formed by a hot isostatic pressing (HIP) and having thermal conductivity of 30 W/m·K, too, the temperature at the central part of the shower plate becomes 450° C. or more or 300° C. or more, and a very large thermal strain is applied to the shower plate 103. In such a high temperature, there arises another problem that a gas of low decomposition temperature cannot be used for the plasma gas because of the decomposition.

In the case AlN is used for the shower plate 103, on the other hand, there occurs efficient dissipation of heat in the radiation direction because of the large thermal conductivity of 160 W/m·K, and the temperature rise at the central part of the shower plate 103 as a result of heat accumulation becomes minimum.

Because of this reason, it has been practiced to use AlN for the shower plate 103 and also for the cover plate in the plasma processing apparatus 100 of FIG. 1 that uses a radial line slot antenna.

However, AlN is a material of large dielectric loss, and the dielectric loss, represented in terms of tan δ takes the value of about $3 \times 10^{-3}$. Thus, in the case the shower plate 103 and the cover plate 102 are formed of AlN, there is caused substantial loss in the microwave emitted by the antenna 110 and efficient excitation of plasma is not possible. In other words, the conventional plasma processing apparatus 100 of FIG. 1 has suffered from the problem, associated with the use of AlN for the shower plate 103 and the cover plate 102, in that efficiency of plasma excitation is not sufficient. As a result, it has been necessary to use a microwave source of large output power in the conventional plasma processing apparatus 100 and ignition of plasma has been difficult.

DISCLOSURE OF THE INVENTION

Accordingly, it is an object of the present invention to provide a novel and useful plasma processing apparatus wherein the foregoing problems are eliminated.

Another and more specific object of the present invention is to provide a plasma processing apparatus exciting plasma by using a radial line slot antenna wherein the efficiency of cooling is improved and simultaneously the efficiency of plasma excitation is improved.

Another object of the present invention is to provide a plasma processing apparatus, comprising:

a processing vessel defined by an outer wall and having a stage for holding a substrate to be processed;

an evacuation system coupled to said processing vessel;

a plasma gas supplying part provided on said processing vessel as a part of said outer wall so as to face said substrate on said stage, said plasma gas supplying part comprising a shower plate facing said substrate on said stage at a first side thereof, said shower plate having a plasma gas passage and a plurality of apertures communicating with said plasma gas passage, and a cover plate provided on a second side of said shower plate opposite to said first side;

a microwave antenna provided on said processing vessel in correspondence to said plasma gas supplying part in an intimate contact with said cover plate; and a microwave power source coupled to said microwave antenna electrically, said microwave antenna being defined by a first outer surface forming a microwave radiation surface, said first outer surface contracting with said cover plate of said plasma gas supplying part, and a second outer surface opposing said first outer surface.

According to the present invention, it becomes possible to cool the shower plate and the cover plate by thermal conduction in the thickness direction thereof by causing the microwave antenna such as the radial line slot antenna to make an intimate contact with the plasma gas supplying part formed of the shower plate and the cover plate and functioning as a microwave transmission window. As a result, the cooling efficiency of the microwave plasma processing apparatus is improved significantly. As a result of the improvement of the cooling efficiency, the accumulation of heat in the shower plate and the cover plate is reduced substantially, and excessive temperature rise of the shower plate is avoided even in the case a material of low dielectric loss such as $Al_2O_3$ is used for the shower plate and the cover plate. Thus, the present invention can satisfy the requirement of high cooling efficiency and high plasma excitation efficiency simultaneously by using a material of low dielectric loss suitable for the microwave transmission window, for the shower plate and the cover plate in the microwave plasma processing apparatus using a radial line slot antenna.

Another object of the present invention is to provide a microwave processing apparatus, comprising:

a processing vessel defined by an outer wall and having a stage for holding a substrate to be processed;

an evacuation system coupled to said processing vessel;

a plasma gas supplying part provided on said processing vessel as a part of said outer wall so as to face said substrate on said stage, said plasma gas supplying part comprising a shower plate facing said substrate on said stage at a first side thereof and a cover plate provided on a second side of said shower plate opposite to said first side;

a microwave antenna provided on said processing vessel in correspondence to said plasma gas supplying part at an opposite thereof with respect to said cover plate; and a microwave power source coupled to said microwave antenna electrically, a gap between said microwave antenna and said cover plate of said plasma gas supplying part being sealed by a seal element, said gap being filled with a thermally conductive gas.

According to the present invention, it is possible to facilitate heat transfer in a minute gap, which may be formed between the microwave antenna and the cover plate of the plasma gas supplying part in correspondence to the slots in the slot plate, or in correspondence to the existence of minute projections and depressions on the surface of the cover plate formed of a dielectric material, by confining a thermally conductive gas in such a gap. Thereby, the problem of local heating is avoided. Thus, the present invention is effective also in the case the microwave antenna and the cover plate constituting the microwave transmission window does not make an intimate contact. By confining the thermally conductive gas with a pressure lower than the atmospheric pressure, the microwave antenna is pressed against the plasma gas supplying part positively by the atmospheric pressure, and as a result, the microwave antenna is pressed intimately and positively to the plasma gas supplying part. For the thermally conductive gas, it is preferable to use He having large ionization energy in view of the effect of suppressing electric discharge at the slot part of the slot plate. In the case He is used for the thermally conductive gas, it is preferable to confine the thermally conductive gas with a pressure of about 0.8 atm.

Another object of the present invention is to provide a microwave plasma processing apparatus, comprising:

a processing vessel defined by an outer wall and having a stage for holding a substrate to be processed;

an evacuation system coupled to said processing vessel;

a plasma gas supplying part provided on said processing vessel as a part of said outer wall so as to face said substrate on said stage, said plasma gas supplying part comprising a shower plate facing said substrate on said stage at a first side thereof, said shower plate having a plasma gas passage and a plurality of apertures communicating with said plasma gas passage, and a cover plate provided on a second side of said shower plate opposite to said first side; and a microwave antenna provided on said processing vessel in correspondence to said plasma gas supplying part in intimate contact with said cover plate;

a microwave power source coupled to said microwave antenna electrically, a process gas supplying part disposed between said shower plate and said substrate on said stage, said process gas supplying part forming an opening causing to pass plasma formed right underneath said shower plate toward said substrate on said stage, said microwave antenna being defined by a first outer surface contacting said cover plate of said plasma gas supplying part and forming a microwave radiation surface and a second outer surface opposite to said first outer surface.

It is preferable in the microwave plasma processing apparatus of the present invention to provide a process gas supplying part between said shower plate and said substrate on said stage so as to form an opening such that the plasma formed right underneath the shower plate can pass toward the substrate on the-stage. By supplying a process gasj different from the plasma gas from such a process gas supplying part, it becomes possible to conduct uniform plasma CVD process on the substrate surface efficiently with a large process rate. Further, by providing a high-frequency power source coupled electrically to the stage, it becomes possible to conduct a plasma etching process by driving the high-frequency power source and simultaneously supplying an etching gas from the process gas supplying part.

Another object of the present invention is to provide a microwave processing apparatus, comprising:

a processing vessel defined by an outer wall and having a stage for holding a substrate to be processed;

an evacuation system coupled to said processing vessel;

a plasma gas supplying part provided on said processing vessel as a part of said outer wall so as to face said substrate on said stage, said plasma gas supplying part comprising a shower plate facing said substrate on said stage at a first side thereof, said shower plate having a plasma gas passage and a plurality of apertures communicating with said plasma gas passage, and a cover plate provided on a second side of said shower plate opposite to said first side;

a microwave antenna provided on said processing vessel in correspondence to said plasma gas supplying part at an opposite side thereof with respect to said cover plate;

a microwave power source coupled to said microwave antenna electrically; and a process gas supplying part disposed between said shower plate and said substrate on said stage, said process gas supplying part forming an opening causing to pass plasma formed right underneath said shower plate toward said substrate on said stage, a gap between said microwave antenna and said cover plate of said plasma gas supplying part being sealed by a seal element, said gap being confined with a thermally conductive gas.

Another object of the present invention is to provide a plasma processing apparatus, comprising:

a processing vessel defined by an outer wall and having a stage for holding a substrate to be processed;

an evacuation system coupled to said processing vessel;

a microwave transmission window formed on a part of said outer wall of said processing vessel so as to face said substrate on said stage;

a plasma gas inlet part supplying a plasma gas into said processing vessel;

a microwave antenna coupled to said microwave transmission window at an outer side of said processing vessel; and a microwave power source coupled to said microwave antenna electrically, said microwave antenna having a microwave radiation surface and provided on said microwave transmission window such that said microwave radiation surface makes a contact therewith.

According to the present invention, it is not always necessary to use said shower plate for introducing a plasma gas into said processing chamber. Thus, it is possible to form a microwave transmission window on a part of said outer wall of the processing chamber so as to face the substrate on the processing chamber and couple the microwave antenna to the microwave transmission window in intimate contact. In such a construction, too, it is possible to remove the heat coming in to the microwave transmission window from the excited plasma efficiently by using the microwave antenna.

Another object of the present invention is to provide a plasma processing apparatus, comprising:

a processing vessel defined by an outer wall and having a stage for holding a substrate to be processed;

an evacuation system coupled to said processing vessel;

a microwave transmission window provided on a part of said outer wall of said processing vessel so as to face said substrate on said stage;

a plasma gas inlet part introducing a plasma gas into said processing vessel;

a microwave antenna coupled to said microwave transmission window at an outer side of said processing vessel; and a microwave power source coupled to said microwave antenna electrically, a gap between a microwave radiation surface of said microwave antenna and said microwave transmission window is sealed by a seal element, said gap being filled with a thermally conductive gas.

Another object of the present invention is to provide a plasma processing apparatus, comprising:

a processing vessel defined by an outer wall and having a stage for holding a substrate to be processed;

an evacuation system coupled to said processing vessel;

a microwave transmission window provided on a part of said outer wall of said processing vessel so as to face said substrate on said stage;

a plasma gas inlet part introducing a plasma gas into said processing vessel;

a microwave antenna coupled to said microwave transmission window at an outer side of said processing vessel;

a microwave power source coupled to said microwave antenna electrically; and a processing gas supplying part disposed between said microwave transmission window and said substrate on said stage, said processing gas supplying part forming an opening causing plasma formed in the vicinity of said microwave transmission window toward said substrate on said stage, said microwave antenna having a microwave radiation surface and is provided on said microwave transmission window such that said microwave radiation surface makes a contact therewith.

According to the present invention, it is not always necessary to use the shower plate for introducing a plasma gas into the processing chamber. Thus, it is possible to provide a microwave transmission window on a part of the processing chamber so as to face the substrate in the processing chamber and provide the microwave antenna in intimate contact therewith. According to such a construction, too, it is possible to remove the heat incoming to the microwave window from the excited plasma efficiently by means of the microwave antenna.

Another object of the present invention is to provide a plasma processing apparatus, comprising:

a processing vessel defined by an outer wall and having a stage for holding a substrate to be processed;

an evacuation system coupled to said processing vessel;

a microwave window provided on a part of said outer wall of said processing vessel so as to face said substrate on said stage;

a plasma gas inlet part introducing a plasma gas into said processing vessel;

a microwave antenna coupled to said microwave window at an outer side of said processing vessel;

a microwave power source coupled to said microwave antenna electrically; and a process gas supplying part disposed between said microwave window and said substrate on said stage, said process gas supplying part forming an opening for causing plasma formed in the vicinity of the microwave transmission window to pass toward the substrate on said stage, a gap between a microwave radiation surface of said microwave antenna and said microwave transmission window is sealed by a seal element, said gap being filled with a thermally conductive gas.

Other objects and further features of the present invention will become apparent from the following description of the best mode of implementing the invention to be made with reference to the drawings.

BRIEF DESCRIPTION OF THE DRAWINGS

FIG. 2 is a diagram explaining the problems caused in the microwave plasma processing apparatus of FIG. 1;

BEST MODE FOR IMPLEMENTING THE INVENTION

Hereinafter, the present invention will be described in detail with reference to embodiments.

FIRST EMBODIMENT

Figure 3A:
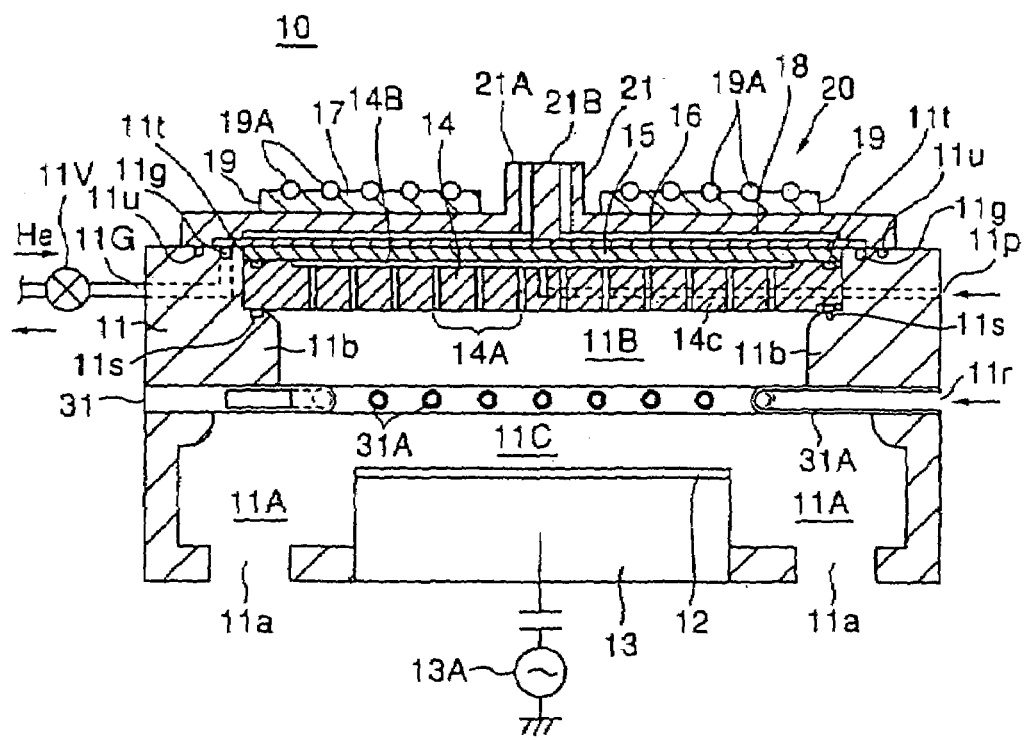
FIGS. 3A and 3B are diagrams showing the construction of a microwave plasma processing apparatus according to a first embodiment of the present invention.
Figure 3B:
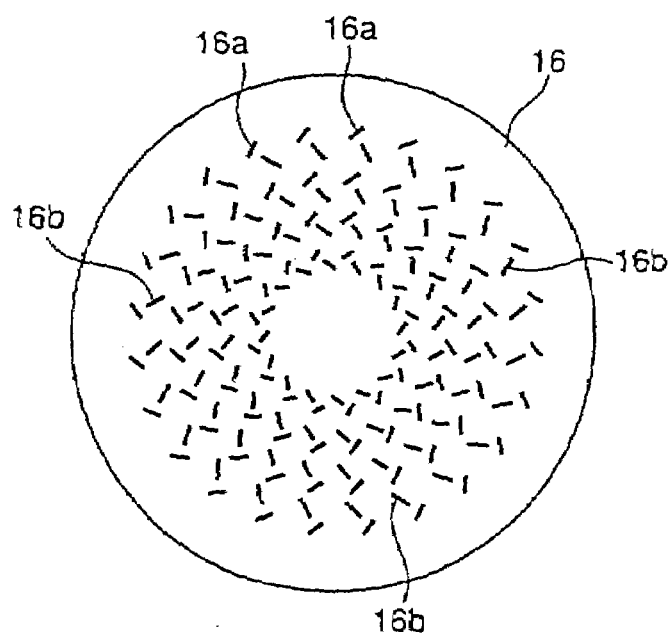

FIGS. 3A and 3B are diagrams showing the construction of a microwave plasma processing apparatus 10 according to a first embodiment of the present invention.

Referring to FIG. 3A, the microwave plasma processing apparatus 10 includes a processing vessel 11 and a stage 13 provided in the processing vessel 11 for holding a substrate 12 to be processed by an electrostatic chuck, wherein the stage 13 is preferably formed of AlN or $Al_2O_3$ by a hot isostatic pressing (HIP) process. In the processing vessel 11, there are formed two or three evacuation ports 11a in a space 11A surrounding the stage 13 with an equal distance, and hence with an axial symmetry with respect to the substrate 12 on the stage 13. The processing vessel 11 is evacuated to a low pressure via the evacuation port 11a by a gradational lead screw pump to be explained later.

The processing vessel 11 is preferably formed of an austenite stainless steel containing Al, and there is formed a protective film of aluminum oxide on the inner wall surface by an oxidizing process. Further, there is formed a disk-shaped shower plate 14 of dense $Al_2O_3$, formed by a HIP process, in the part of the outer wall of the processing vessel 11 corresponding to the substrate 12 as a part of the outer wall, wherein the shower plate 14 includes a large number of nozzle apertures 14A. The $Al_2O_3$ shower plate 14 thus formed by a HIP process is formed by using an $Y_2O_3$ additive and has porosity of 0.03% or less. This means that the $Al_2O_3$ shower plate is substantially free from pores or pinholes and has a very large, while not so large as that of AlN, thermal conductivity for a ceramic of 30 W/m·K.

The shower plate 14 is mounted on the processing vessel 11 via a seal ring 11s, and a cover plate 15 of dense $Al_2O_3$ formed also of an HIP process is provided on the shower plate 14 via a seal ring 11t. The shower plate 14 is formed with a depression 14B communicating with each of the nozzle apertures 14A and serving for the plasma gas passage, at the side thereof contacting with the cover plate 15, wherein the depression 14B also communicates with another plasma gas passage 14C formed in the interior of the shower plate 14 in communication with a plasma gas inlet 11p formed on the outer wall of the processing vessel 11.

The shower plate 14 is held by an extending part 11b formed on the inner wall of the processing vessel 11, wherein the extending part 11b is formed with a round surface at the part holding the shower plate 14 so as to suppress electric discharge.

Thus, the plasma gas such as Ar or Kr supplied to the plasma gas inlet 11p is supplied to a space 11B right underneath the shower plate 14 uniformly via the apertures 14A after being passed through the passages 14C and 14B in the shower plate 14.

On the cover plate 15, there is provided a radial line slot antenna 20 formed of a disk-shaped slot plate 16 formed with a number of slots 16a and 16b shown in FIG. 3B in intimate contact with the cover plate 15, a disk-shaped antenna body 17 holding the slot plate 16, and a retardation plate 18 of a dielectric material of low loss such as $Al_2O_3$, $SiO_2$ or $Si_3N_4$ sandwiched between the slot plate 16 and the antenna body 17. The radial line slot antenna 20 is mounted on the processing vessel 11 by way of a seal ring 11u, and a microwave of 2.45 GHz or 8.3 GHz frequency is fed to the radial line slot antenna 20 from an external microwave source (not shown) via a coaxial waveguide 21. The microwave thus supplied is radiated into the interior of the processing vessel from the slots 16a and 16b on the slot plate 16 via the cover plate 15 and the shower plate 14. Thereby, the microwave cause excitation of plasma in the plasma gas supplied from the apertures 14A in the space 11B right underneath the shower plate 14. It should be noted that the cover plate 15 and the shower plate 14 are formed of $Al_2O_3$ and function as an efficient microwave-transmitting window. In order to avoid plasma excitation in the plasma gas passages 14A–14C, the plasma gas is held at the pressure of about 6666 Pa–13332 Pa (about 50–100 Torr) in the foregoing passages 14A–14C.

In order to improve intimate contact between the radial line slot antenna 20 and the cover plate 15, the microwave plasma processing apparatus 10 of the present embodiment has a ring-shaped groove 11g on a part of the processing vessel 11 so as to engage with the slot plate 16. By evacuating the groove 11g via an evacuation port 11G communicating therewith, the pressure in the gap formed between the slot plate 16 and the cover plate 15 is reduced and the radial line slot antenna 20 is urged firmly upon the cover plate 15 by the atmospheric pressure. It should be noted that such a gap includes not only the slots 16a and 16b formed in the slot plate 16 but also a gap formed by other various reasons. It should be noted further that such a gap is sealed by the seal ring 11u provided between the radial line slot antenna 20 and the processing vessel 11.

By filling the gap between the slot plate 16 and the cover plate 15 with an inert gas of small molecular weight via the evacuation port 11G and the groove 11g, heat transfer from the cover plate 15 to the slot plate 16 is facilitated. Thereby, it is preferable to use He for such an inert gas in view of large thermal conductivity and large ionization energy. In the case the gap is filled with He, it is preferable to set the pressure to about 0.8 atm. In the construction of FIG. 3, there is provided a valve 11V on the evacuation port 11G for the evacuation of the groove 15g and filling of the inert gas into the groove 15g.

It should be noted that an outer waveguide tube 21A of the coaxial waveguide 21A is connected to the disk-shaped antenna body 17 while a central conductor 21B is connected to the slot plate 16 via an opening formed in the retardation plate 18. Thus, the microwave fed to the coaxial waveguide 21A is propagated in the radial direction between the antenna body 17 and the slot plate 16 and is emitted from the slots 16a and 16b.

FIG. 3B shows the slots 16a and 16b formed on the slot plate 16.

Referring to FIG. 3B, the slots 16a are arranged in a concentric manner such that there is provided a slot 16b for each slot 16a such that the slot 16b crosses the slot 16a perpendicularly and such that the slot 16b is aligned concentrically with the slot 16a. The slots 16a and 16b are formed with an interval corresponding to the wavelength of the microwave compressed by the radiation plate 16 in the radial direction of the slot plate 16, and as a result, the microwave is radiated from the slot plate 16 in the form of a near plane wave. Because the slots 16a and the slots 16b are formed in the mutually perpendicular relationship, the microwave thus radiated form a circularly polarized wave including two perpendicular polarization components.

In the plasma processing apparatus 10 of FIG. 3A, there is provided a cooling block 19 formed with a cooling water passage 19A on the antenna body 17, and the heat accumulated in the shower plate 14 is absorbed via the radial line slot antenna 20 by cooling the cooling block 19 by the cooling water in the cooling water passage 19A. The cooling water passage 19A is formed on the cooling block 19 in a spiral form, and cooling water having a controlled oxidation-reduction potential is supplied thereto, wherein the control of the oxidation reduction potential is achieved by eliminating oxygen dissolved in the cooling water by way of bubbling of an $H_2$ gas.

Figure 4:
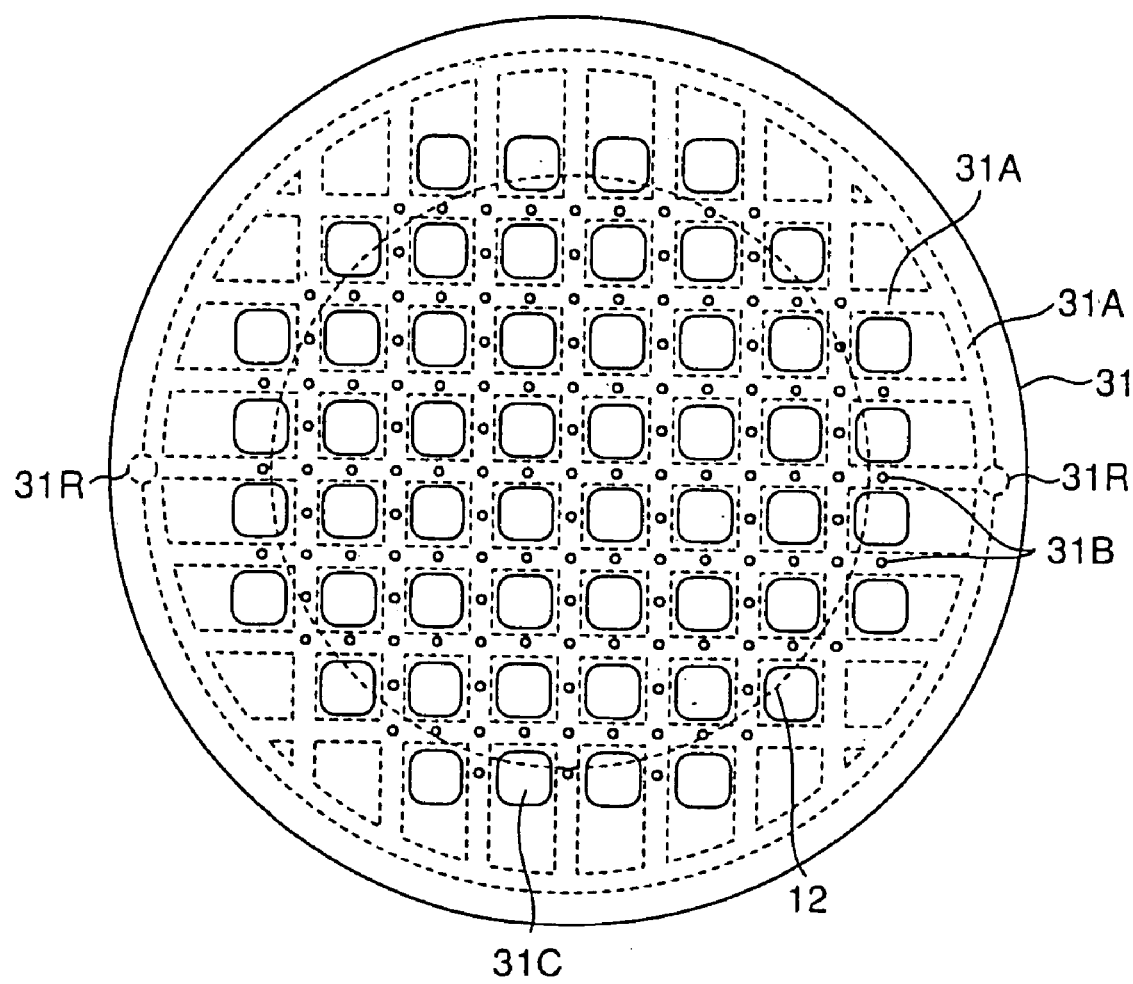
FIG. 4 is a diagram showing the construction of a process gas supplying mechanism of the microwave plasma processing apparatus of FIG. 3A.

In the microwave plasma processing apparatus 10 of FIG. 3A, there is further provided a process gas supply structure 31 in the processing vessel 11 between the shower plate 14 and the substrate 12 on the stage 13, wherein the process gas supply structure 31 has gas passages 31A arranged in a lattice shape and releases a process gas supplied from a process gas inlet port 11r provided on the outer wall of the processing vessel 11 through a large number of process gas nozzle apertures 31B (see FIG. 4). Thereby, desired uniform substrate processing is achieved in a space 11C between the process gas supply structure 31 and the substrate 12. Such substrate processing includes plasma oxidation processing, plasma nitridation processing, plasma oxynitridation processing, and plasma CVD processing. Further, it is possible to conduct a reactive ion etching of the substrate 12 by supplying a readily decomposing fluorocarbon gas such as $C_4F_8$, $C_5F_8$ or $C_4F_6$ or an etching gas containing F or Cl and further by applying a high-frequency voltage to the stage 13 from a high-frequency power source 13A.

In the microwave plasma processing apparatus 10 of the present embodiment, it is possible to avoid deposition of reaction byproducts on the inner wall of the processing vessel by heating the outer wall of the processing vessel 11 to a temperature of about 150° C. Thereby, the microwave plasma processing apparatus 10 can be operated constantly and with reliability, by merely conducing a dry cleaning process once a day or so.

FIG. 4 is a bottom view showing the construction of the process gas supply structure 31 of FIG. 3A.

Referring to FIG. 4, the process gas supply structure 31 is formed by a conductive body such as an Al alloy containing Mg or a stainless steel added with Al and the lattice shaped gas passage 31A is connected to the process gas inlet port 11r at a process gas supply port 31R and releases the process gas uniformly into the foregoing space 11C from the process gas nozzle apertures 31B formed at the bottom surface. Further, there are formed openings 31C in the process gas supply structure 31 between the adjacent process gas passages 31A for passing the plasma or the process gas contained in the plasma therethrough. In the case the process gas supply structure 31 is formed of an Al alloy containing Mg, it is preferable to form a fluoride film on the surface thereof. In the case the process gas supplying structure 31 is formed of a stainless steel added with Al, it is preferable to form a passivation film of aluminum oxide on the surface thereof. In the plasma processing apparatus 10 of the present invention, the energy of incident plasma is low because of the low electron temperature of the excited plasma, and the problem of metal contamination of the substrate 12 by the sputtering of the process gas supply structure 31 is avoided. Further, it is possible to form the process gas supply structure 31 by a ceramic such as alumina.

The lattice shaped process gas passages 31A and the process gas nozzle apertures 31B are formed so as to encompass an area slightly larger than the substrate 12 represented in FIG. 4 by a broken line. By providing the process gas supply structure 31 between the shower plate 14 and the substrate 12, the process gas is excited by the plasma and a uniform processing becomes possible by using such plasma excited process gas.

In the case of forming the process gas supply structure 31 by a conductor such as a metal, the process gas supply structure 31 can form a shunting plane of the microwave by setting the interval between the lattice shaped process gas passages 31A shorter than the microwave wavelength. In such a case, the microwave excitation of plasma takes place only in the space 11B, and there occurs excitation of the process gas in the space 11C including the surface of the substrate 12 by the plasma that has caused diffusion from the excitation space 11B. Further, such a construction can prevent the substrate being exposed directly to the microwave at the time of ignition of the plasma, and thus, damaging of the substrate by the microwave is avoided.

In the microwave plasma processing apparatus 10 of the present embodiment, the supply of the process gas is controlled uniformly by the process gas supply structure 31, and the problem of excessive dissociation of the process gas on the surface of the substrate 12 is eliminated. Thus, it becomes possible to conduct the desired substrate processing even in the case there is formed a structure of large aspect ratio on the surface of the substrate 12 up to the very bottom of the high aspect ratio structure. This means that the microwave plasma processing apparatus 10 is effective for fabricating various semiconductor devices of different generations characterized by different design rules.

Figure 5:
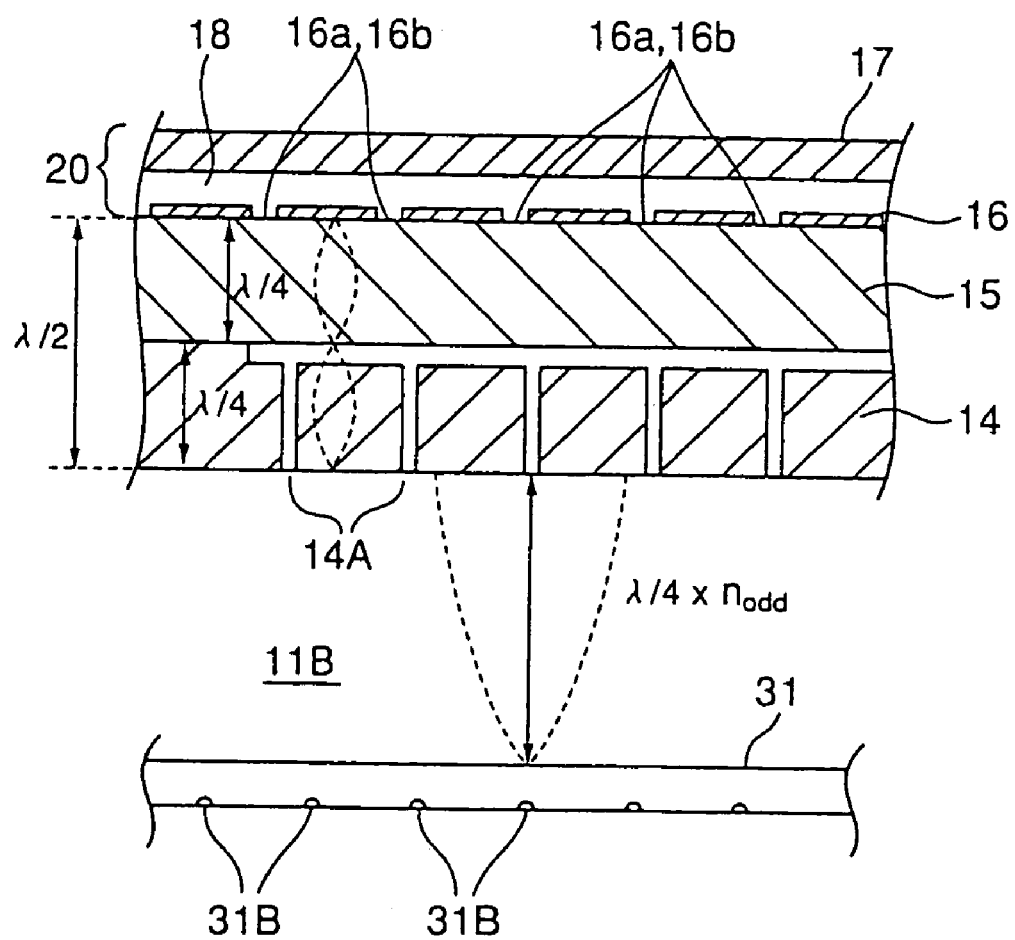
FIG. 5 is a diagram showing the part near the junction of the radial line slot antenna and the processing vessel of the microwave plasma processing apparatus of FIG. 3A.

FIG. 5 is a diagram showing a part of the plasma processing apparatus 10 of FIG. 3A including the shower plate 14, the cover plate 15 and the radial line slot antenna 20.

Referring to FIG. 5, it is preferable to set the distance between the bottom surface of the shower plate 14 and the process gas supplying structure 31 to be equal to an integer multiple of quarter wavelength of the microwave for efficient excitation of plasma in the region right underneath the shower plate 14. By doing so, the anti-node of the standing wave formed between the process gas supply structure 31 functioning as the microwave shunting plane and the bottom surface of the shower plate 14 is located right underneath the shower plate 14.

In order to avoid electric discharge at the slots 16a and 16b, it is preferable that the node of the microwave emitted from the radial line slot antenna 20 is located coincident to the slots 16a and 16b. Further, it is preferable that the node is located also coincident tot eh bottom surface of the shower plate 14 for avoiding the electric discharge in the shower nozzle apertures 14A. Because of this reason, it is preferable to set that the total thickness of the shower plate 14 and the cover plate 15 to be equal to one-half the wavelength of the microwave.

By setting the thickness of the shower plate 14 and the cover plate 15 to be equal to the quarter wavelength of the microwave, in particular, the node of the microwave is located in the vicinity of the interface between the shower plate 14 and the cover plate 15, and the electric discharge in the plasma gas passage 14B, which is formed along this interface, is effectively suppressed.

Figure 6:
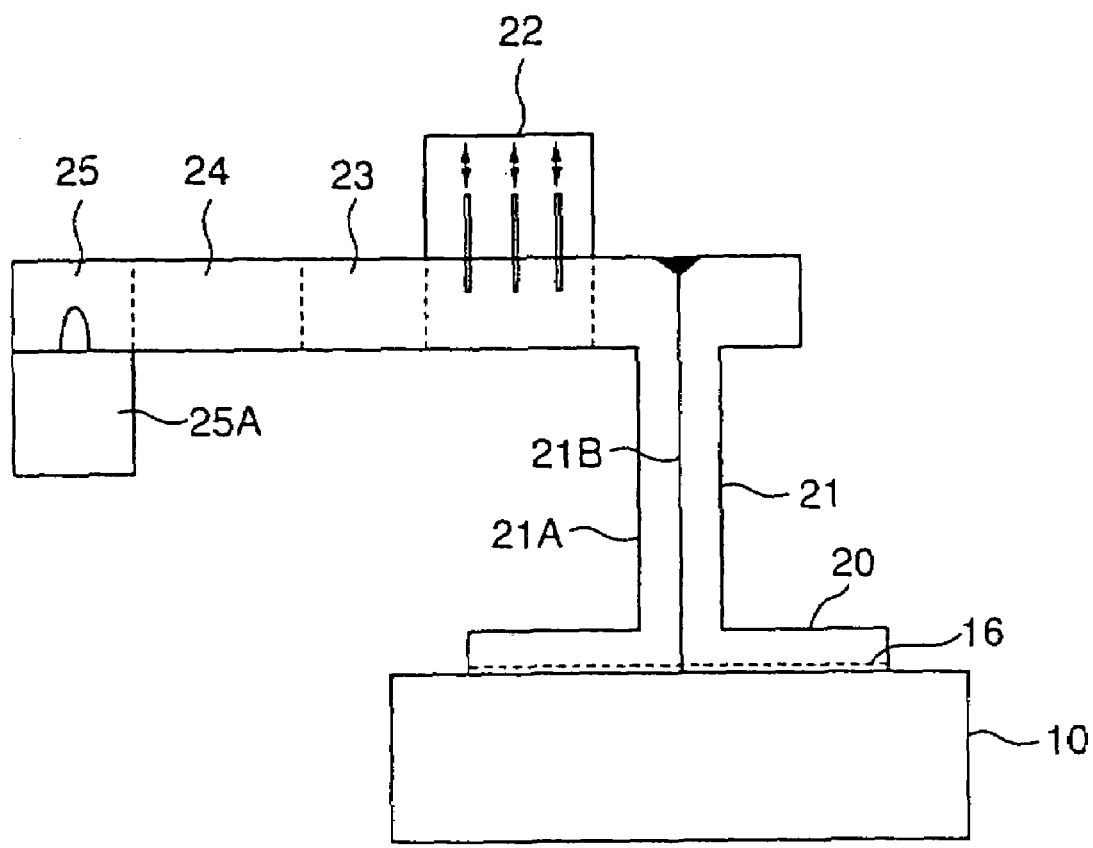
FIG. 6 is a diagram showing the construction of the microwave power source coupled to the microwave plasma processing apparatus of FIG. 3A.

FIG. 6 shows the schematic construction of the microwave source connected to the coaxial waveguide 21 of FIG. 3A.

Referring to FIG. 6, the coaxial waveguide is connected to an edge of the waveguide extending from an oscillation part 25 including therein a magnetron 25A oscillating at the frequency of 2.45 GHz or 8.3 GHz via an isolator 24, a power monitor 23 and a tuner 22 in this order. Thus, the microwave formed by the oscillator 25 is supplied to the radial line slot antenna 20, and the microwave reflected back from the high-density plasma formed in the plasma processing apparatus 10 is returned again to the radial line slot antenna 20 after conducting an impedance adjustment by the tuner 22. Further, the isolator 24 is an element having directivity and functions so as to protect the magnetron 25A in the oscillation part 25 from the reflection wave.

Figure 1A:
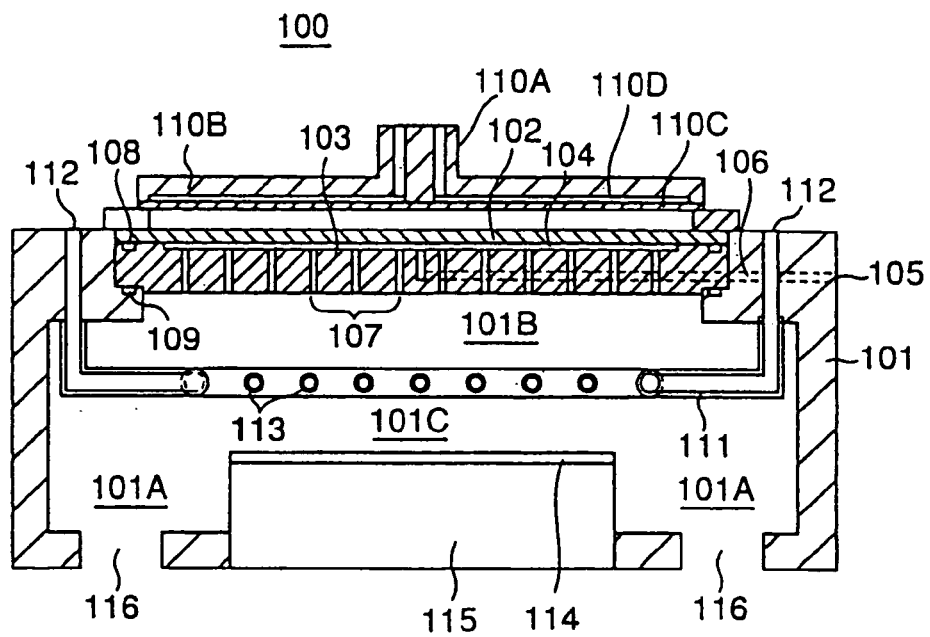
FIGS. 1A and 1B are diagrams showing the construction of a conventional microwave plasma processing apparatus that uses a radial line slot antenna.
Figure 1B:
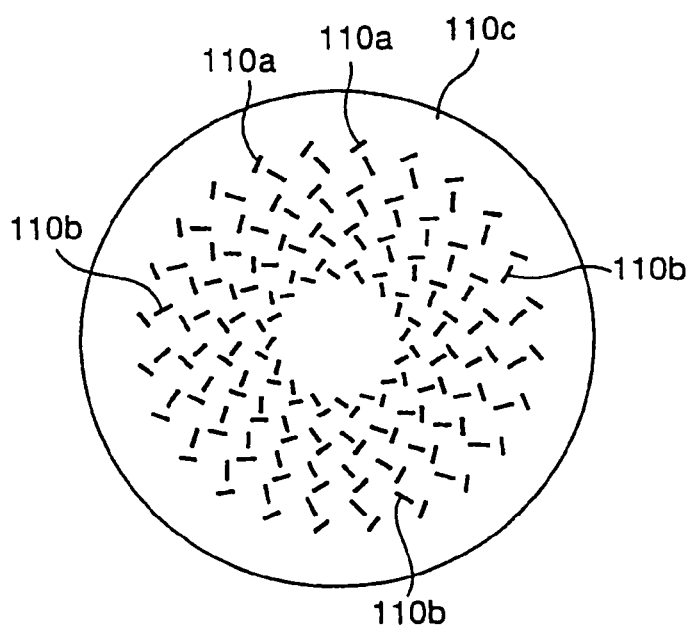

In the microwave plasma processing apparatus 10 of the present embodiment, the distance between the shower plate 14 exposed to the heat caused by the plasma and the cooing part is reduced substantially as compared with the conventional microwave plasma processing apparatus of FIGS. 1A and 1B, and as a result, it becomes possible to use a material such as $Al_2O_3$ having a small dielectric loss and also a small thermal conductivity for the microwave transmission window in place of AlN, which is characterized by large dielectric loss. Thereby, the efficiency of plasma processing and hence the processing rate are improved while simultaneously suppressing the temperature rise of the shower plate.

In the microwave plasma processing apparatus 10 of the present embodiment, it should further be noted that the gas including the reaction byproduct formed in the space 11C as a result of the substrate processing forms a stable gas flow to the space 11A at the outer surrounding because of the reduced distance between the shower plate 14 and the substrate 12 facing the shower plate 14, and the byproduct is removed from the space 11C quickly. By maintaining the temperature of the outer wall of the processing vessel 11 to be about 150° C., it becomes possible to eliminate the deposition of the reaction byproduct on the inner wall of the processing vessel 11 substantially completely, and the processing apparatus 10 becomes ready for the next process quickly.

In the present embodiment, it should be noted that the microwave antenna 20 is not necessarily limited to the radial line slot antenna. For example, it is also possible to use a horn antenna 20B as represented in a modification of FIG. 7. In the case the substrate 12 is a large-diameter substrate, in particular, it is possible to arrange plural horn antennas 20B on the processing vessel 11 as represented in a modification of FIG. 8. Thereby, it becomes possible to cool the cover plate 15 and the shower plate 14 via the horn antenna 20B while maintaining uniformity of plasma processing. For this purpose, it is also possible to provide a cooling mechanism 20b on the horn antenna 20B of FIG. 7 or 8.

Figure 9:
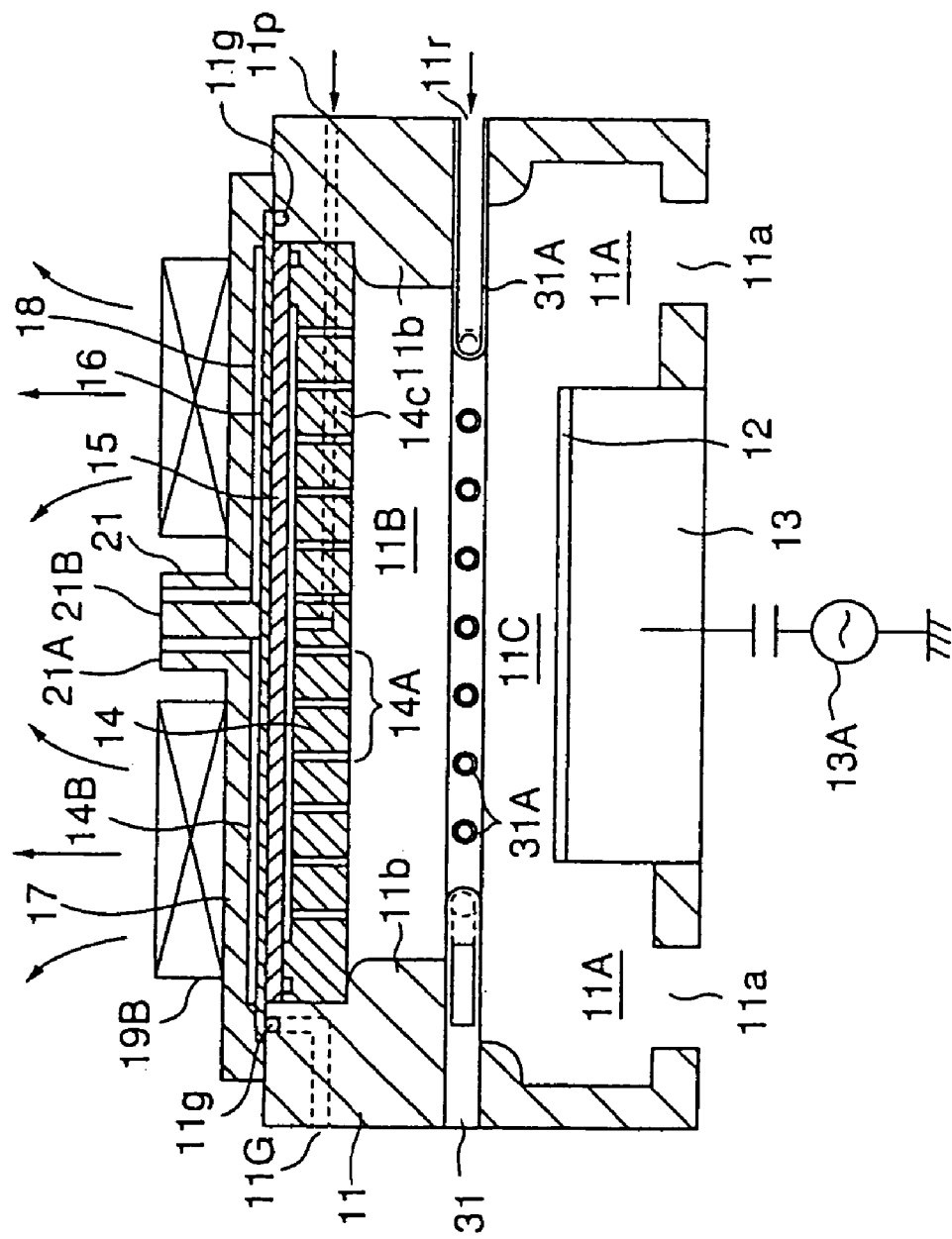
FIG. 9 is a diagram showing the construction of a microwave plasma processing apparatus according to a further modification of the present invention.

Further, it is also possible to provide an air cooling mechanism 19B in place of the cooing part 19 or 19A as represented in a modification of FIG. 9.

SECOND EMBODIMENT

Figure 10:
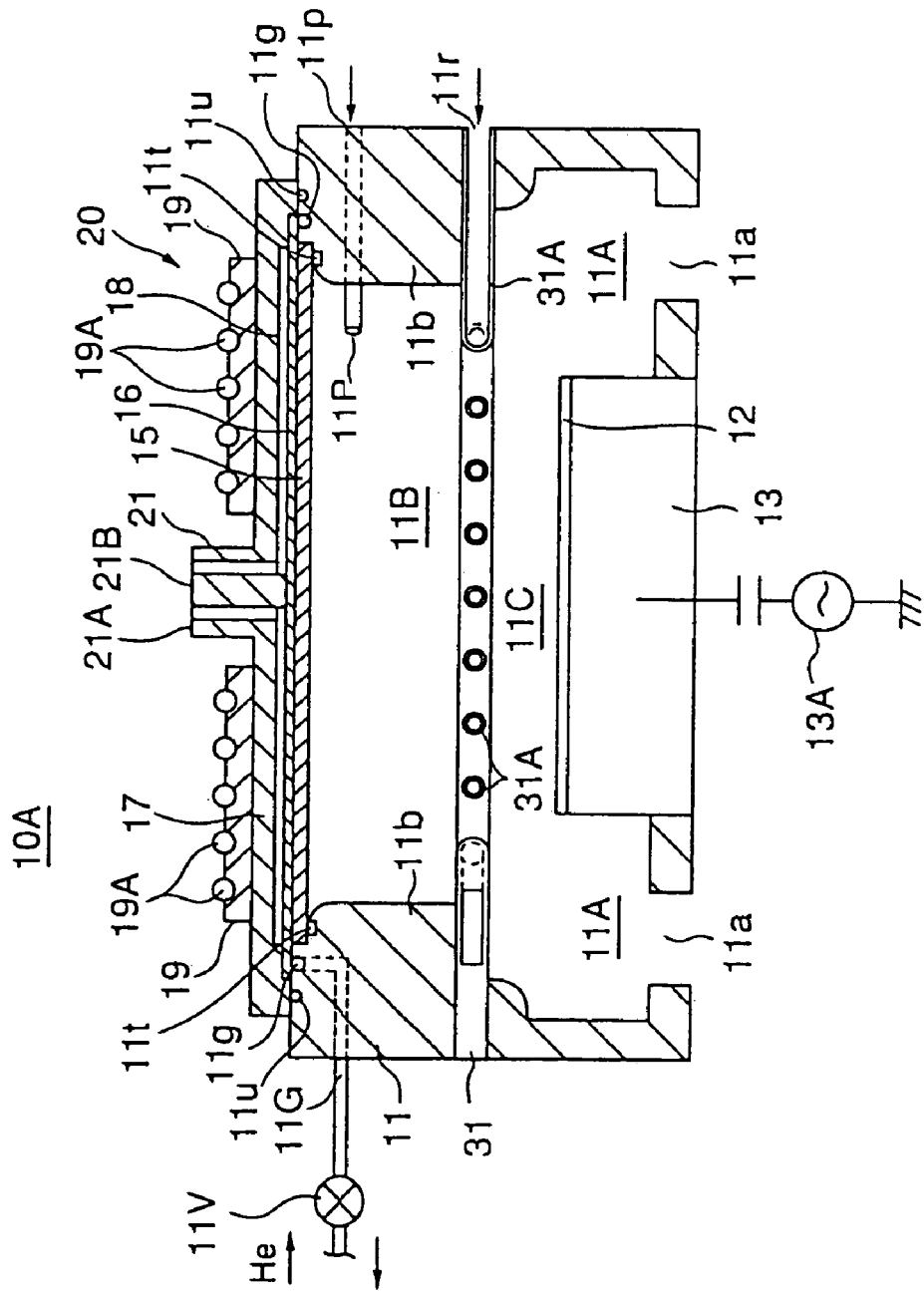
FIG. 10 is a diagram showing the construction of a microwave plasma processing apparatus according to a second embodiment of the present invention.

FIG. 10 shows the construction of a plasma processing apparatus 10A according to a second embodiment of the present invention, wherein those parts explained previously are designated by the same reference numerals and the description thereof will be omitted.

Referring to FIG. 2, the plasma processing apparatus 10A has a construction similar to the plasma processing apparatus 10 of FIGS. 3A and 3B except that the shower plate 14 is removed and a gas inlet port 11P extends into the space 11B in the processing vessel 11 from the gas inlet port 11p.

In such a construction, too, it is possible to form high-density plasma in the space 11B by exciting the plasma gas introduced from the gas inlet port 11P by the microwave supplied from the radial line slot antenna 20.

The high-density plasma thus formed may be somewhat inferior to the high-density plasma obtained for the case of using the shower plate 14 in terms of uniformity, but the plasma processing apparatus 10A has an advantageous feature of substantially simplified construction as compared with the previously explained plasma processing apparatus 10. In the present embodiment, too, the heat flux incident to the cover plate 15 is absorbed by the cooling part 17 via the radial line slot antenna 20.

Figure 7:
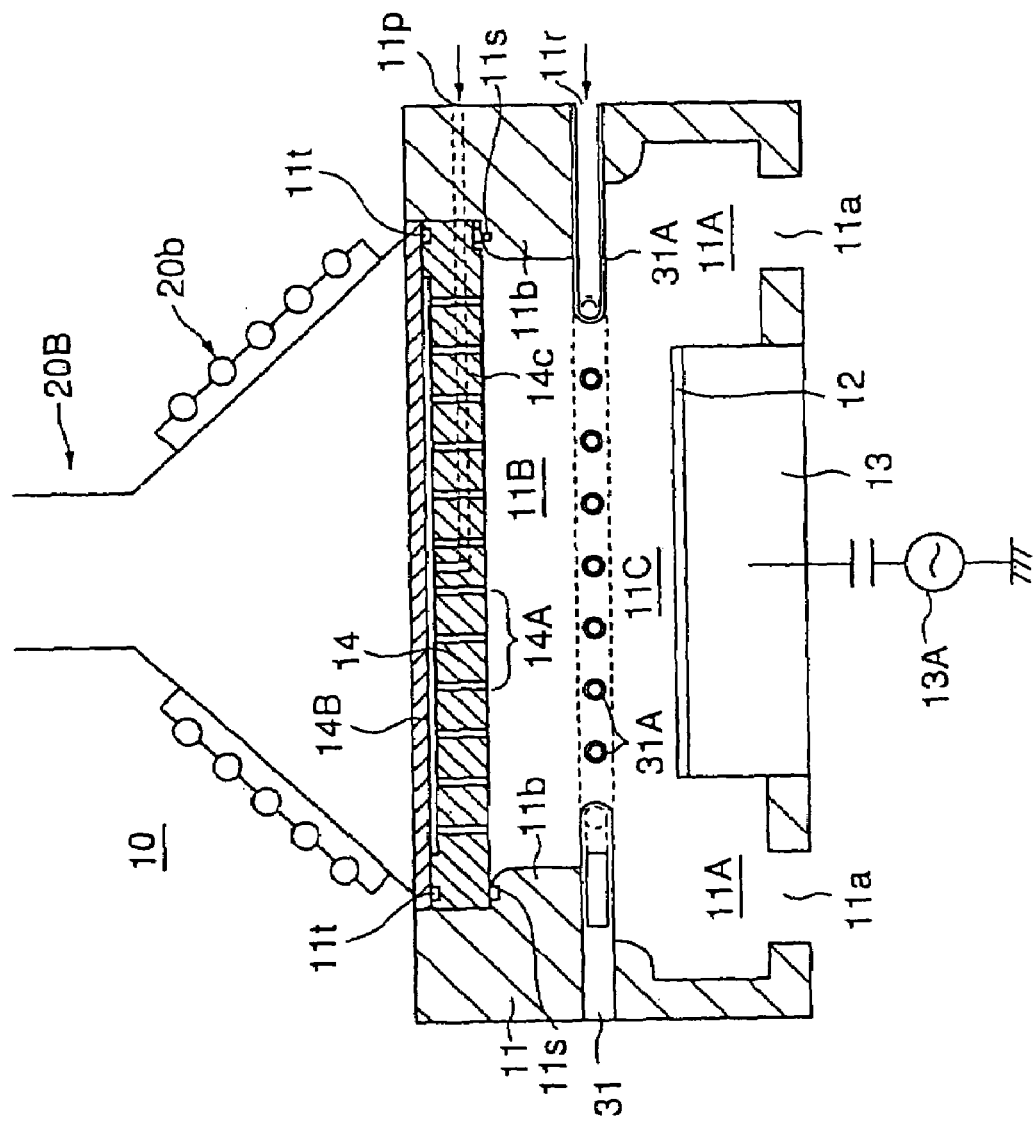
FIG. 7 is a diagram showing the construction of a microwave plasma processing apparatus according to a modification of the present invention.
Figure 8:
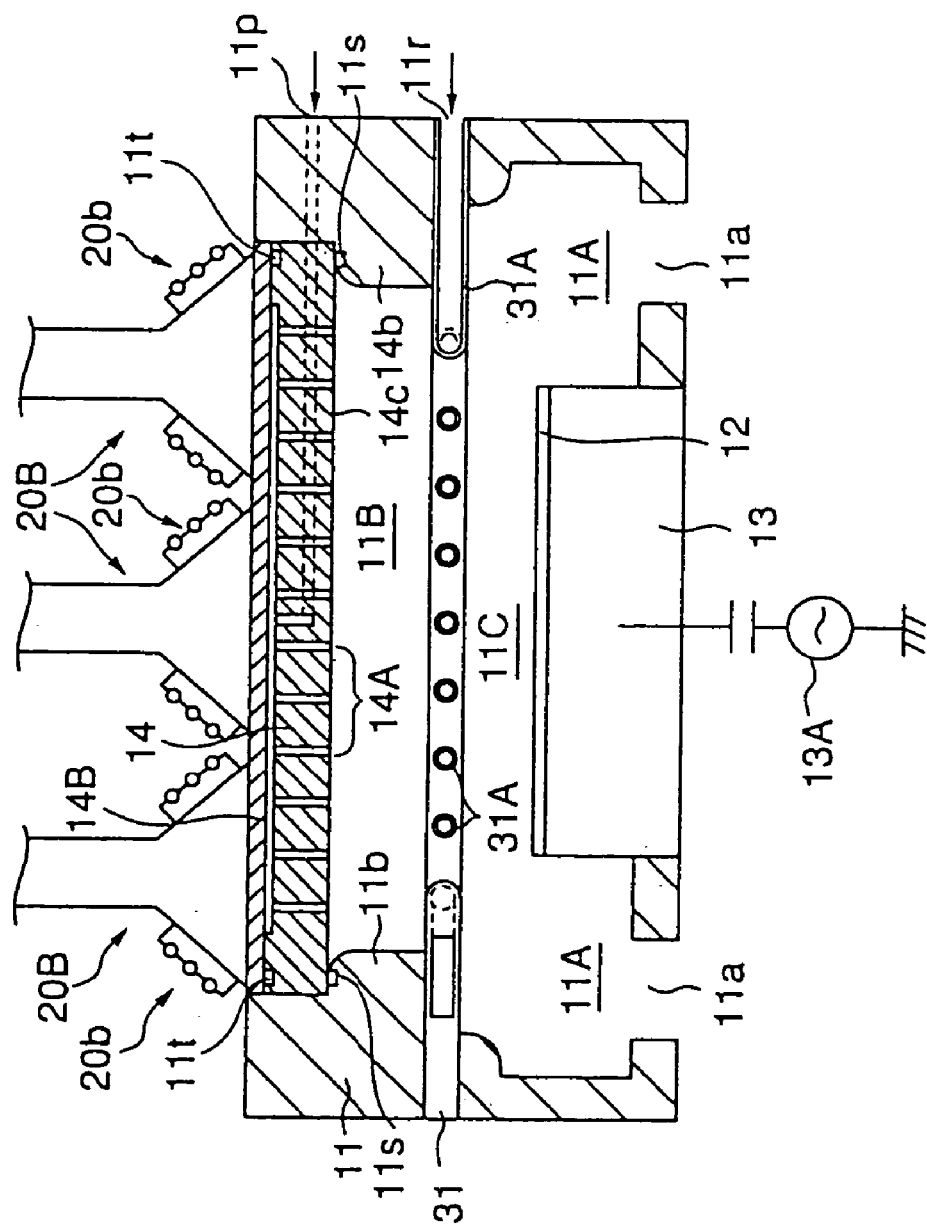
FIG. 8 is a diagram showing the construction of a microwave plasma processing apparatus according to another modification of the present invention.

In the plasma processing apparatus 10A of FIG. 7, it is preferable to provide the gas inlet port 11P at plural locations in symmetry with respect to the substrate for realizing as uniform plasma formation as possible.

THIRD EMBODIMENT

Figure 11:
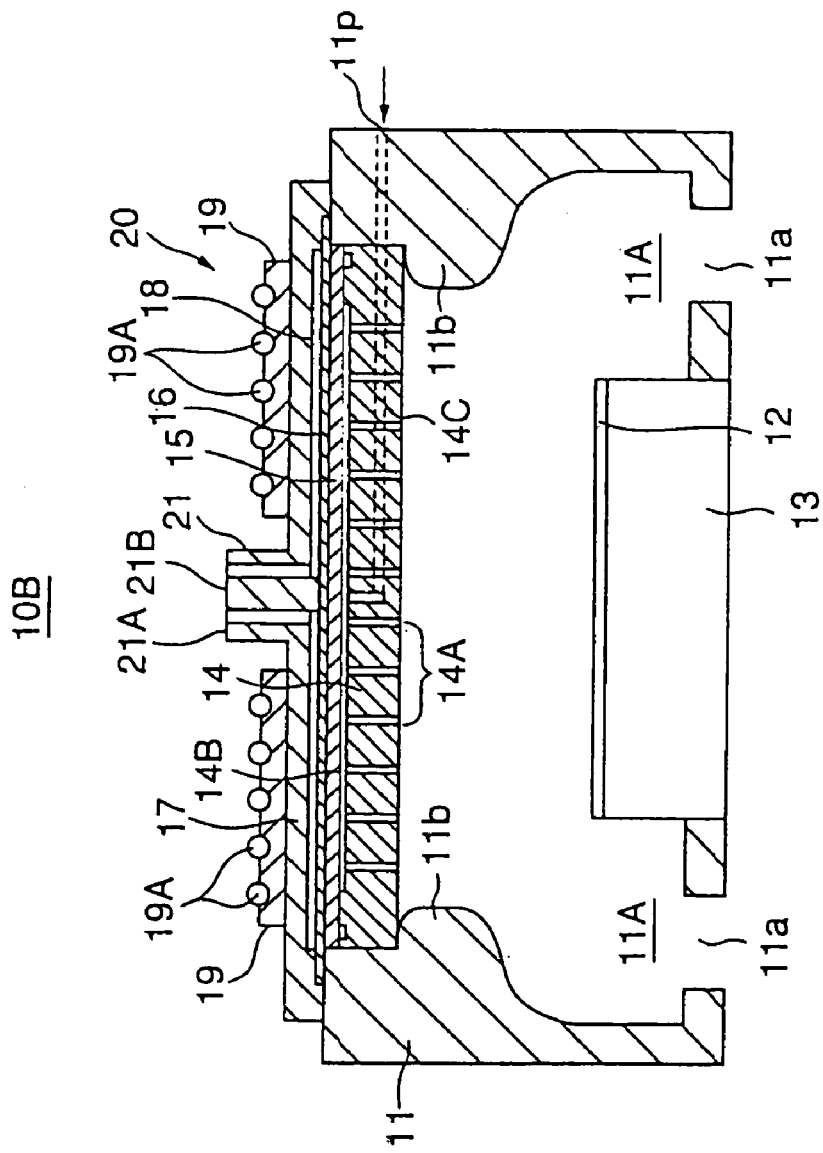
FIG. 11 is a diagram showing the construction of a microwave plasma processing apparatus according to a third embodiment of the present invention.

FIG. 11 is shows the construction of a microwave plasma processing apparatus 10B according to a second embodiment of the present invention, wherein those parts in FIG. 11 corresponding to the parts described previously are designated by the same reference numerals and the description thereof will be omitted.

Referring to FIG. 11, the microwave plasma processing apparatus 10B of the present embodiment has a construction similar to that of the microwave plasma processing apparatus 10 of the previous embodiment, except that the process gas supply structure 13 is removed in the microwave plasma processing apparatus 10B of the present embodiment. Further, the extension part 11b of the processing vessel 11 is formed with a round surface for avoiding electric discharge.

In the plasma processing apparatus 10B of such a construction, the plasma formed right underneath the shower plate 14 reflects the microwave, and thus, there occurs no problems such as the microwave reaching the surface of the substrate 12 or plasma is excited in the region near the surface. At the time of ignition of the plasma, it is possible to avoid damaging of the substrate by the microwave irradiation, by increasing the pressure in the processing vessel temporarily at the time of the plasma ignition to a state of 133 Pa (about 1 Torr), for example, so as to ensure plasma ignition. Once the plasma is ignited, the pressure inside the processing vessel is adjusted quickly to the process pressure such as 13.3 Pa (about 0.1 Torr).

In the plasma processing apparatus 10B, in which there is no process gas supply mechanism 30, it is necessary to provide the process gas from the plasma gas inlet port 11p together with the plasma gas. By using such a construction, it is possible to conduct oxidation processing, nitridation processing or oxynitridation processing on the surface of the substrate 12.

FOURTH EMBODIMENT

Figure 12:
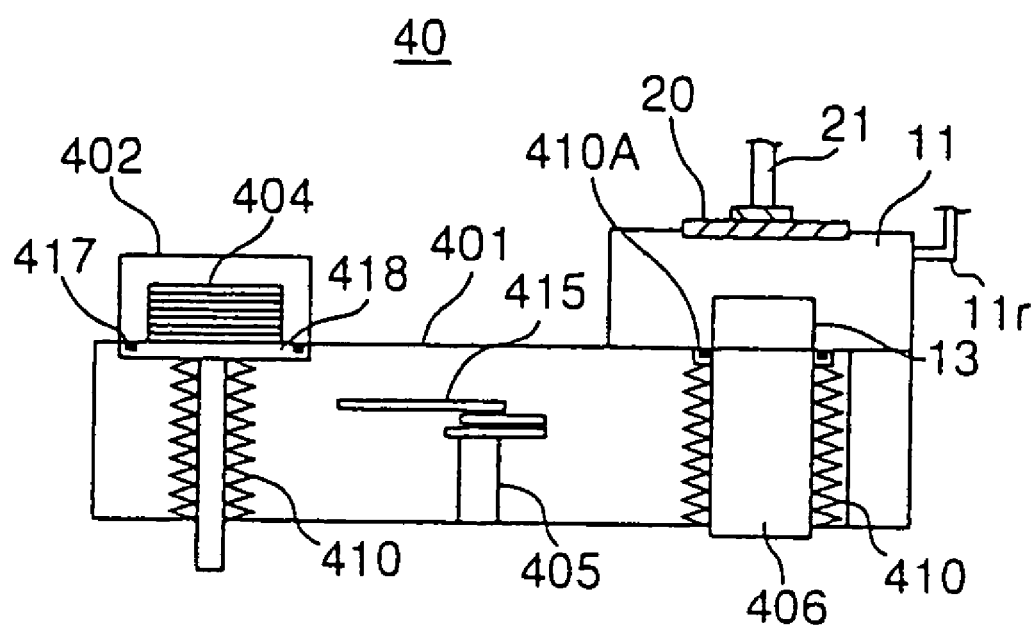
FIG. 12 is a diagram showing the construction of a semiconductor fabrication apparatus according to a fourth embodiment of the present invention that uses the microwave plasma processing apparatus of FIGS. 3A and 3B.

FIG. 12 is a cross-sectional diagram showing the entire construction of a semiconductor fabrication apparatus 40 according to a fourth embodiment of the present invention wherein the semiconductor fabrication apparatus 40 includes the microwave plasma processing apparatus 10 of FIGS. 3A and 3B.

Referring to FIG. 12, the semiconductor fabrication apparatus 40 includes a vacuum transfer chamber 40 provided with a robot 405 having a transfer arm 415, and the microwave plasma processing apparatus 11 is provide on a top surface of the vacuum transfer chamber 401. Thereby, the stage 13 is formed movable in the upward and downward directions by an elevating cylinder 406 surrounded by a bellows. In the state the stage 13 is moved to the fully lowered state, the substrate 12 is loaded or unloaded by the transfer arm 415, while in the state the stage 13 is moved to the fully lifted state, the stage 13 is disconnected from the vacuum transfer chamber 401 by a seal 410A and the desired substrate processing is conducted.

On the vacuum transfer chamber 401, there is provided a load lock chamber 402 equipped with an movable stage 418 movable in the upward and downward directions and holding a stack 404 of the substrates to be processed, wherein the load lock chamber 402 is provide at a different location. In the fully lifted state of the stage 418, the load lock chamber 402 is disconnected from the vacuum transfer chamber 401 by the seal 417, while in the fully lowered state, the substrate stack 404.is lowered into the vacuum transfer chamber 401. In this state, the transfer arm 415 picks up a substrate from the substrate stack 404 or returns a processed substrate to the substrate stack 404.

In the semiconductor fabrication apparauts 40 of such a construction, loading and unloading of the substrate to and from the microwave plasma processing apparatus 10 is conducted in the vertical direction, without passing through the sidewall surface. Further, evacuation of the processing vessel is conducted by plural pumps disposed in axially symmetrical manner. Thus, axially symmetric formation of plasma in the processing vessel is guaranteed.

Figure 13:
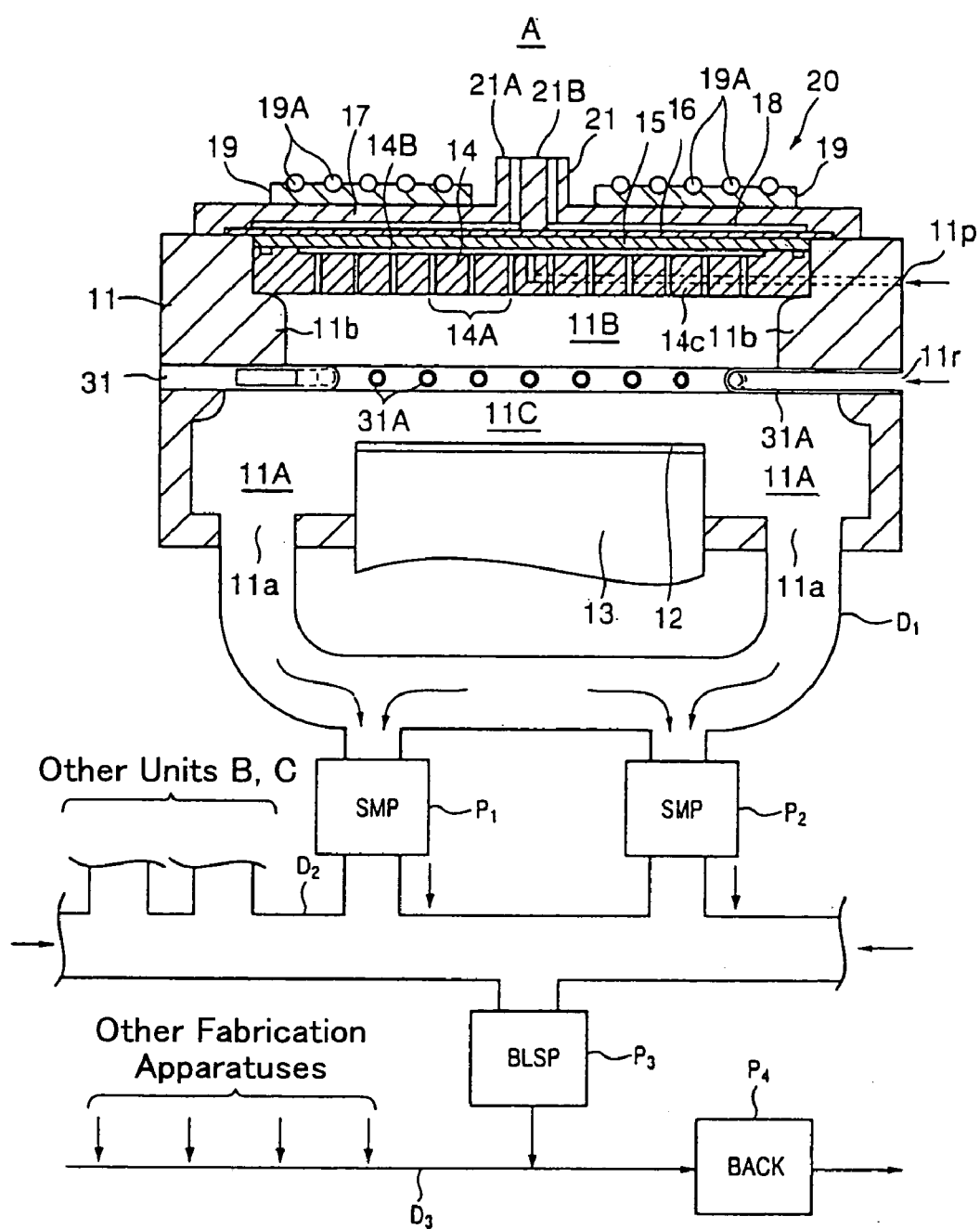
FIG. 13 is a diagram showing the construction of an evacuation system of the semiconductor fabrication apparatus of FIG. 12.

FIG. 13 shows the construction of the processing unit A.

Figure 14A:
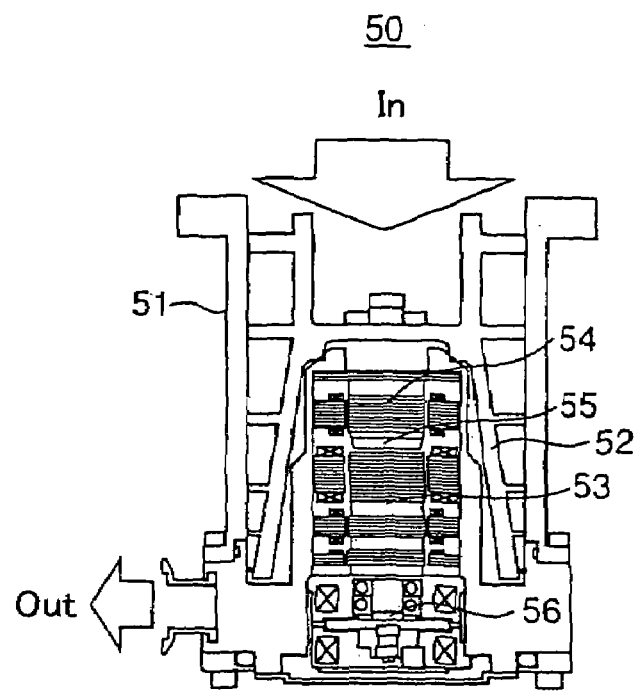
FIGS. 14A and FIGS. 14B are diagrams showing the construction of a screw molecular pump used in the evacuation system of FIG. 13.
Figure 14B:
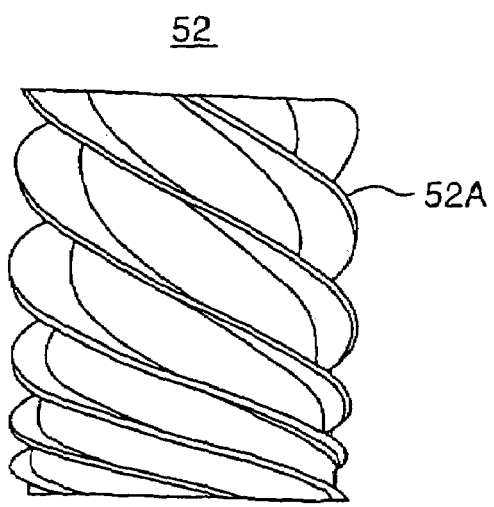

Referring to FIG. 13, each evacuation port 11a of the processing vessel 11 is connected to a duct $D_1$, and the duct $D_1$ is evacuated by screw molecular pumps $P_1$ and $P_2$ each having a construction shown in FIGS. 14A and 14B. The evacuation side of the screw molecular pumps $P_1$ and $P_2$ is connected to an evacuation line $D_2$ provided commonly to other processing units B and C of the semiconductor fabrication apparatus 40, and the evacuation line $D_2$ is connected to an evacuation line $D_3$ connected commonly t other similar semiconductor fabrication apparatuses via an intermediate booster pump $P_3$.

FIGS. 14A and 14B show the construction of the screw molecular pumps $P_1$ and $P_2$.

Referring to FIG. 14A, the screw molecular pump has a cylindrical body 51 having a pump inlet at an end part of the body 51 and a pump outlet on the sidewall of the body 51 near the bottom part. In the body 51, there is provided a rotor 52 shown in FIG. 14B, and a gradational lead screw 52A is formed on the rotor 52. It should be noted that the gradational lead screw 52A has a construction in which there is a large pitch formed at the pump inlet part and the pitch is decreased toward the outlet. Associated with this, the lead angle of the screw is decreased gradually from the inlet side toward the outlet side. Further, the volume of the pump chamber is decreased gradually from the inlet side toward the outlet side.

Further, the screw molecular pump of FIG. 14A includes a motor 53 provided in the rotor 52, an angle detector 54 detecting the angular position of the rotor 52 and a magnet 55 cooperating with the angle detector 54, wherein the rotor 523 is urged toward the outlet side by an electromagnet mechanism 56.

Such a screw molecular pump has a simple construction and is operable over a wide pressure range from the atmospheric pressure to several millitorrs with small electric power consumption. Further, the screw pump can obtain a pumping speed reaching 320 mL/min, which is larger than the pumping speed of conventional turbo molecular pump.

Figure 15:
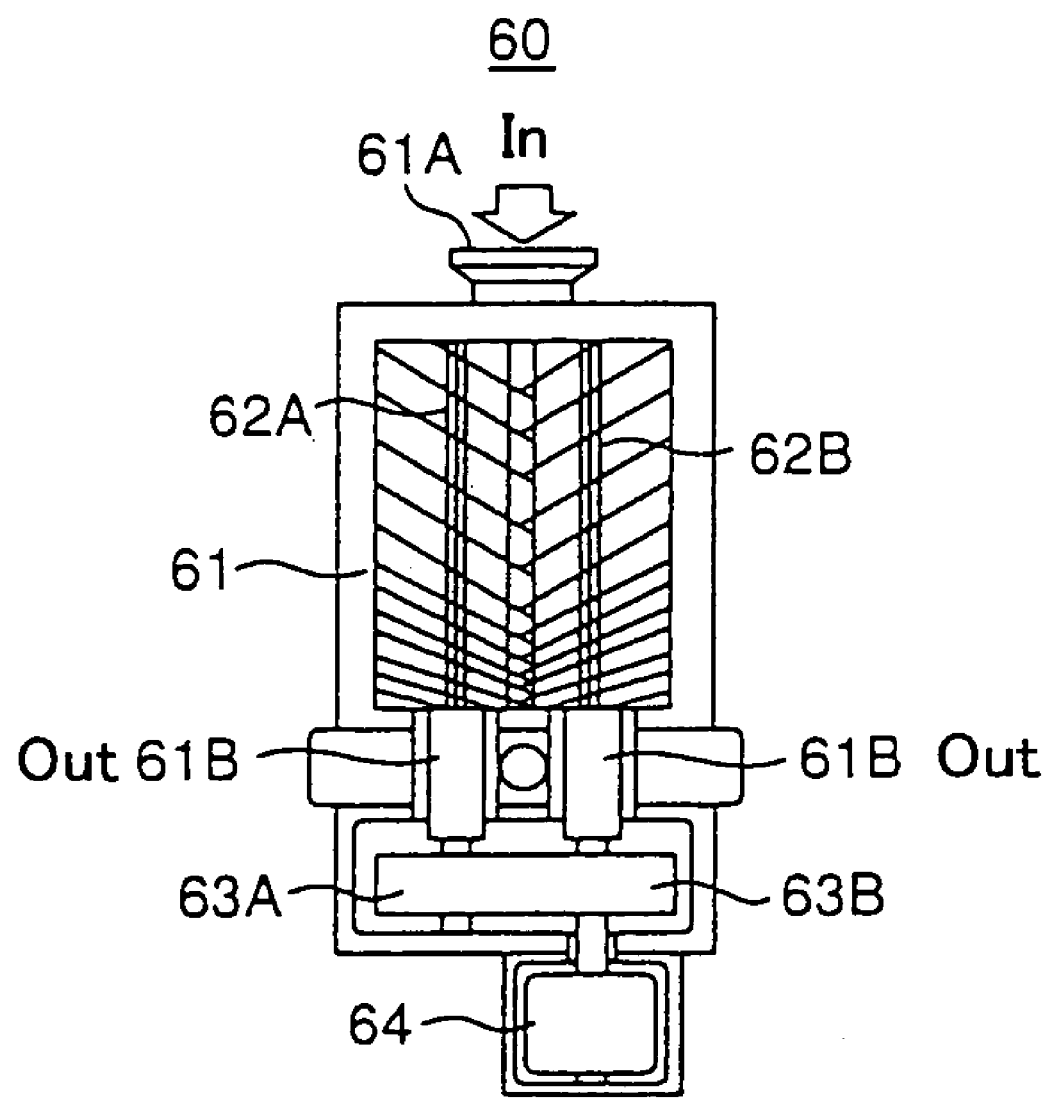
FIG. 15 is a diagram showing the construction of a gradational lead screw pump used in the evacuation system of FIG. 13.

FIG. 15 shows the construction of a gradational lead screw pump (GLSP) 60 used for the intermediate booster pump P3 for evacuating the screw pumps $P_1$ and $P_2$ in the construction of FIG. 15.

Referring to FIG. 15, the gradational lead screw pump includes, in a pump body 61 having an inlet 61A at an end and outlets 63A and 63B at another end, a pair of screw rotors 62A and 62B each changing a screw pitch thereof gradually from an inlet side to an outlet side as shown in FIG. 14B, in a meshing relationship of the screws, wherein the rotors 62A and 62B are driven by a motor 64 via gears 63A and 63B.

The gradational lead screw pump 60 of such a construction is operable over a wide pressure range from ordinary pressure to a low pressure of as much as $10^{-4}$ Torr, and can achieve a flow rate reaching 2500 L/min.

In the construction of FIG. 13, in which the semiconductor fabrication apparatus is evacuated by the common back pump $P_4$ via the intermediate booster pump $P_3$, the back pump $P_4$ is operated in the most efficient pressure range, and the electric power consumption is reduced substantially.

Figure 16:
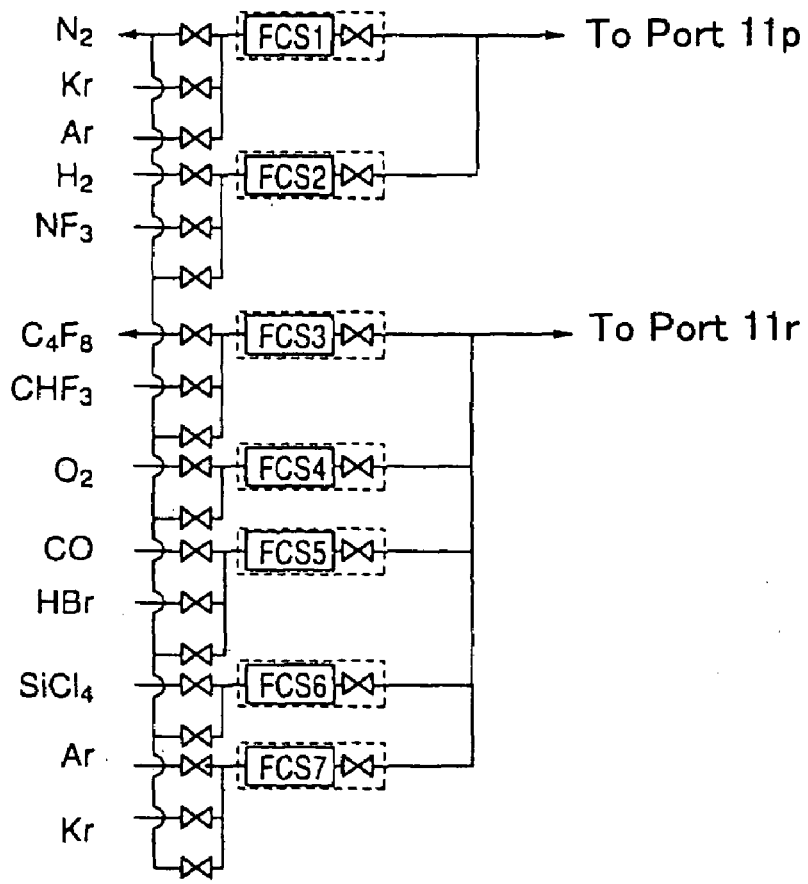
FIG. 16 is a diagram showing the construction of a gas supply system used in a processing unit of FIG. 13.

FIG. 16 shows the construction of the gas supplying system cooperating with each of the processing units A–C in the semiconductor fabrication apparatus 40 of FIGS. 7A and 7B.

As explained before, the semiconductor fabrication apparatus 40 avoids deposition of reaction byproduct formed associated with the substrate processing on the processing vessel 11 of the microwave plasma processing apparatus 10 by maintaining the processing vessel 11 at a temperature of about 150° C. Thus, the processing unit of FIG. 8 has a feature that the memory or hysteresis of the preceding processing can be erased completely without conducting a specific cleaning process.

Thus, by using the unit 13 of FIG. 13, it becomes possible to conduct different substrate processing one after another by switching the plasma gas and/or process gas. For this, however, it is necessary to provide a gas supply system that can switch the process gas quickly.

Referring to FIG. 16, one or two gases selected fro $N_2$, Kr, Ar, $H_2$, $NF_3$, $C_4F_8$, $CHF_3$, $O_2$, CO, HBr, $SiCl_4$ and the like, are supplied to the plasma gas inlet port 11p provided on the processing vessel 11 in communication with the shower plate 14 through the first and/or second flow rate control apparatuses FCS1 and FCS2, and one or more gases selected from $N_2$, Kr, Ar, $H_2$, $NF_3$, $C_4F_8$, $CHF_3$, $O_2$, CO, HBr, $SiCl_4$ and the like, are supplied to the process gas inlet port 11r communicating with the process gas supply structure 30 via the third through seventh flow rate control apparatuses FCS3–FCS7.

Thereby, by using a flow rate control apparatus having a construction in which a control valve 71, a manometer 72, a stop-valve 73 and an orifice 74 are formed consecutively on a straight tube 70 and by controlling the pressure $P_2$ at the downstream side of the orifice 74 to be equal to or smaller than one-half the pressure $P_1$ at the upstream side of the stop valve 73 ($P_1 \geqq 2P_2$), it becomes possible to supply the process gas instantaneously with a predetermined flow rate. This is because there is no dead space in the flow rate control apparatus in which flow rate control is not possible.

Figure 17:
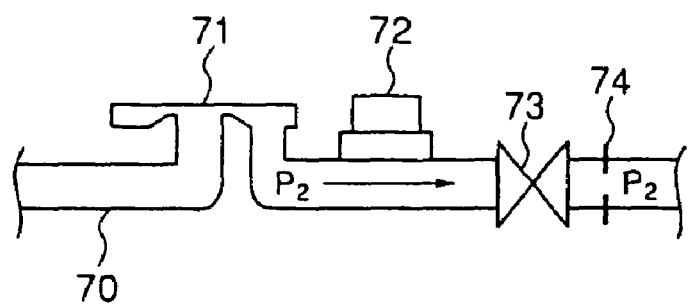
FIG. 17 is a diagram showing the construction of a flow control apparatus used in the gas supply system of FIG. 16.

Thus, by using the flow control apparatus of FIG. 17 in the gas supply system of FIG. 16, it becomes possible to switch the plasma gas or process gas instantaneously depending on the type of the substrate processing to be conducted in the processing unit.

In the semiconductor processing apparatus 40, it should be noted that not only the plasma processing apparatus 10 but also the plasma processing apparatuses according to the modifications thereof, or the plasma processing apparatuses 10A and 10B according to other embodiments can also be used.

Further, the present invention is not limited to the specific embodiments noted above but various variations and modifications may be made within the scope of the invention set forth in claims.

INDUSTRIAL APPLICABILITY

According to the present invention, it is possible to cool the shower plate and cover plate constituting the microwave transmission window by heat conduction in the thickness direction thereof, by causing the microwave antenna to make an intimate contact with the microwave transmission window formed in a part of the outer wall of the processing vessel, and/or by confining a thermally conductive gas between the microwave antenna and the microwave transmission window. Thereby, the cooling efficiency of the microwave plasma processing apparatus is improved significantly. As a result of such cooling, accumulation of heat in the microwave transmission window by the plasma is reduced substantially, and as a result, the problem of excessive temperature rise is eliminated even in the case a low loss material such as $Al_2O_3$ is used for the microwave transmission window. Thus, by using a material of low dielectric loss for the microwave transmission window in the microwave plasma processing apparatus of the present invention that uses a microwave antenna, it becomes possible to meet for the requirement of high cooling efficiency and also the requirement of high plasma excitation efficiency simultaneously.

What is claimed is:

1. A plasma processing apparatus, comprising:
   a processing vessel defined by an outer wall and having a stage for holding a substrate to be processed;
   an evacuation system coupled to said processing vessel;
   a plasma gas supplying part provided on said processing vessel as a part of said outer wall so as to face said substrate on said stage, said plasma gas supplying part comprising a shower plate facing said substrate on said stage at a first side thereof, said shower plate having a plasma gas passage and a plurality of apertures communicating with said plasma gas passage, and a cover plate provided on a second side of said shower plate opposite to said first side;
   a microwave antenna provided on said processing vessel in correspondence to said plasma gas supplying part in an intimate contact with said cover plate;
   a microwave power source coupled to said microwave antenna electrically; and
   a contact surface between said microwave antenna and said cover plate of said plasma gas supplying part is sealed in a manner such that a pressure thereof can be adjusted,
   said microwave antenna being defined by said contact surface forming a microwave radiation surface, said contact surface contacting with said cover plate of said plasma gas supplying part, and an outer surface opposing said contact surface.

2. The microwave plasma processing apparatus as claimed in claim 1, wherein said contact surface is sealed by a seal element and a pressure regulation valve is connected to said contact surface.

3. The microwave plasma processing apparatus as claimed in claim 1, wherein a thermally conductive gas is confined in said contact surface between said microwave antenna and said cover plate of said plasma gas supplying part.

4. The microwave plasma processing apparatus as claimed in claim 3, wherein said thermally conductive gas is He.

5. The microwave plasma processing apparatus as claimed in claim 1, wherein said contact surface is maintained at a pressure lower than an atmospheric pressure.

6. The microwave plasma processing apparatus as claimed in claim 5, wherein said contact surface is maintained at a pressure of about 0.8–0.9 atm.

7. The microwave plasma processing apparatus as claimed in claim 1, further comprising a cooling part provided on said microwave antenna, said cooling part being provided on said outer surface.

8. The microwave plasma processing apparatus as claimed in claim 7, wherein said cooling part is provided with a passage of cooling water.

9. The microwave plasma processing apparatus as claimed in claim 7, wherein said cooling part is formed of an air-cooling mechanism.

10. The microwave plasma processing apparatus as claimed in claim 1, wherein said shower plate and said cover plate is formed of $Al_2O_3$.

11. The microwave plasma processing apparatus as claimed in claim 1, wherein there is provided a retardation plate of $Al_2O_3$, $SiO_2$ or $Si_3N_4$ in said microwave antenna.

12. The microwave plasma processing apparatus as claimed in claim 1, further comprising a high-frequency power source connected to said stage.

13. A microwave processing apparatus, comprising:
   a processing vessel defined by an outer wall and having a stage for holding a substrate to be processed;
   an evacuation system coupled to said processing vessel;
   a plasma gas supplying part provided on said processing vessel as a part of said outer wall so as to face said substrate on said stage, said plasma gas supplying part comprising a shower plate facing said substrate on said stage at a first side thereof and a cover plate provided on a second side of said shower plate opposite to said first side;

a microwave antenna provided on said processing vessel in correspondence to said plasma gas supplying part at an opposite side thereof and in intimate contact with said cover plate;

a microwave power source coupled to said microwave antenna electrically; and a gap between said microwave antenna and said cover plate of said plasma gas supplying part being sealed by a seal element, said gap being filled with a thermally conductive gas.

14. The microwave plasma processing apparatus as claimed in claim 13, wherein said thermally conductive gas is formed of He.

15. The microwave plasma processing apparatus as claimed in claim 13, further comprising a cooling part provided on said microwave antenna, said cooling part is provided on an outer surface of said microwave antenna.

16. The microwave plasma processing apparatus as claimed in claim 13, further comprising a high frequency power source connected to said stage.

17. A microwave plasma processing apparatus, comprising:

a processing vessel defined by an outer wall and having a stage for holding a substrate to be processed;

an evacuation system coupled to said processing vessel;

a plasma gas supplying part provided on said processing vessel as a part of said outer wall so as to face said substrate on said stage, said plasma gas supplying part comprising a shower plate facing said substrate on said stage at a first side thereof, said shower plate having a plasma gas passage and a plurality of apertures communicating with said plasma gas passage, and a cover plate provided on a second side of said shower plate opposite to said first side;

a microwave antenna provided on said processing vessel in correspondence to said plasma gas supplying part in intimate contact with said cover plate;

a microwave power source coupled to said microwave antenna electrically, a process gas supplying part disposed between said shower plate and said substrate on said stage; and a contact surface between said microwave antenna and said cover plate of said plasma gas supplying part is sealed in a matter such that a pressure thereof can be adjusted, said process gas supplying part forming an opening causing to pass plasma formed right underneath said shower plate toward said substrate on said stage, and said microwave antenna being defined by said contact surface contacting said cover plate of said plasma gas supplying part and forming a microwave radiation surface and an outer surface opposite to said first outer surface.

18. The microwave plasma processing apparatus as claimed in claim 17, wherein said contact surface is sealed by a seal element and a pressure adjusting valve is connected to said contact surface.

19. The microwave plasma processing apparatus as claimed in claim 17, wherein a thermally conductive gas is confined in said a contact surface between said microwave antenna and said cover plate of said plasma gas supplying part.

20. The microwave plasma processing apparatus as claimed in claim 19, wherein said thermally conductive gas is formed of He.

21. The microwave plasma processing apparatus as claimed in claim 17, wherein said contact surface is maintained at a pressure lower than an atmospheric pressure.

22. The microwave plasma processing apparatus as claimed in claim 21, wherein said contact surface is maintained at a pressure of about 0.8–0.9 atm.

23. The microwave plasma processing apparatus as claimed in claim 17, further comprising a cooling part provided on said microwave antenna, said cooling part being provided on said second outer surface of said microwave antenna.

24. The microwave plasma processing apparatus as claimed in claim 23, wherein said cooling part has a passage of cooling water.

25. The microwave plasma processing apparatus as claimed in claim 23, wherein said cooling part is formed of an air-cooling mechanism.

26. The microwave plasma processing apparatus as claimed in claim 17, wherein said shower plate and said cover plate are formed of $Al_2O_3$.

27. The microwave plasma processing apparatus as claimed in claim 17, wherein said microwave antenna includes a retardation plate of $Al_2O_3$, $SiO_2$ or $Si_3N_4$.

28. The microwave plasma processing apparatus as claimed in claim 17, further comprising a high frequency power source connected to said stage.

29. A microwave processing apparatus, comprising:

a processing vessel defined by an outer wall and having a stage for holding a substrate to be processed;

an evacuation system coupled to said processing vessel;

a plasma gas supplying part provided on said processing vessel as a part of said outer wall so as to face said substrate on said stage, said plasma gas supplying part comprising a shower plate facing said substrate on said stage at a first side thereof, said shower plate having a plasma gas passage and a plurality of apertures communicating with said plasma gas passage, and a cover plate provided on a second side of said shower plate opposite to said first side;

a microwave antenna provided on said processing vessel in correspondence to said plasma gas supplying part at an opposite side thereof and in intimate contact with said cover plate;

a microwave power source coupled to said microwave antenna electrically;

a process gas supplying part disposed between said shower plate and said substrate on said stage, said process gas supplying part forming an opening causing to pass plasma formed right underneath said shower plate toward said substrate on said stage; and a gap between said microwave antenna and said cover plate of said plasma gas supplying part being sealed by a seal element, said gap being filled with a thermally conductive gas.

30. The microwave plasma processing apparatus as claimed in claim 29, wherein said thermally conductive gas is formed of He.

31. The microwave plasma processing apparatus as claimed in claim 29, further comprising a cooling part provided on said microwave antenna, said cooling part being provided on an outer surface of said microwave antenna.

32. The microwave plasma processing apparatus as claimed in claim 29, further comprising a high frequency power source connected to said stage.

33. A plasma processing apparatus, comprising:

a processing vessel defined by an outer wall and having a stage for holding a substrate to be processed;

an evacuation system coupled to said processing vessel;
a microwave transmission window formed on a part of said outer wall of said processing vessel so as to face said substrate on said stage;
a plasma gas inlet part supplying a plasma gas into said processing vessel;
a microwave antenna coupled to said microwave transmission window at an outer side of said processing vessel; and
a microwave power source coupled to said microwave antenna electrically,
said microwave antenna having a microwave radiation surface and provided on said microwave transmission window such that said microwave radiation surface makes a contact therewith,
wherein a contact surface of said microwave radiation surface between said microwave antenna and said microwave transmission window is sealed in a manner such that a pressure therein can be adjusted.

34. The plasma processing apparatus as claimed in claim 33, wherein said contact surface of said microwave radiation surface and said microwave transmission window is sealed by a seal element and a pressure adjusting valve is connected so as to enable adjustment of a pressure of said contact surface between said microwave radiation surface and said microwave transmission window.

35. The plasma processing apparatus as claimed in claim 33, wherein a thermally conductive gas is confined to said contact surface between said microwave radiation surface and said cover plate of said microwave transmission window.

36. The plasma processing apparatus as claimed in claim 35, wherein said thermally conductive gas is formed of He.

37. The microwave plasma processing apparatus as claimed in claim 33, wherein said contact surface is maintained at a pressure lower than an atmospheric pressure.

38. The plasma processing apparatus as claimed in claim 37, wherein said contact surface is maintained at a pressure of about 0.8–0.9 atm.

39. The microwave plasma processing apparatus as claimed in claim 33, further comprising a cooling part provided on said microwave antenna, said cooling part being provided on a surface opposite to said microwave radiation surface.

40. The microwave plasma processing apparatus as claimed in claim 39, wherein said cooling part has a passage of cooling water.

41. The microwave plasma processing apparatus as claimed in claim 39, wherein said cooling part is formed of an air-cooling mechanism.

42. A plasma processing apparatus, comprising:
a processing vessel defined by an outer wall and having a stage for holding a substrate to be processed;
an evacuation system coupled to said processing vessel;
a microwave transmission window provided on a part of said outer wall of said processing vessel so as to face said substrate on said stage;
a plasma gas inlet part introducing a plasma gas into said processing vessel;
a microwave antenna in intimate contact with said microwave transmission window at an outer side of said processing vessel;
a microwave power source coupled to said microwave antenna electrically; and
a gap between a microwave radiation surface of said microwave antenna and said microwave transmission window is sealed by a seal element,
said gap being filled with a thermally conductive gas.

43. The plasma processing apparatus as claimed in claim 42, wherein said thermally conductive gas is formed of He.

44. The microwave plasma processing apparatus as claimed in claim 42, further comprising a cooling part provided on said microwave antenna, said cooling part being provided on an outer surface of said microwave antenna.

45. A plasma processing apparatus, comprising:
a processing vessel defined by an outer wall and having a stage for holding a substrate to be processed;
an evacuation system coupled to said processing vessel;
a microwave transmission window provided on a part of said outer wall of said processing vessel so as to face said substrate on said stage;
a plasma gas inlet part introducing a plasma gas into said processing vessel;
a microwave antenna coupled to said microwave transmission window at an outer side of said processing vessel;
a microwave power source coupled to said microwave antenna electrically; and
a processing gas supplying part disposed between said microwave transmission window and said substrate on said stage,
said processing gas supplying part forming an opening causing plasma formed in the vicinity of said microwave transmission window toward said substrate on said stage,
said microwave antenna having a microwave radiation surface and is provided on said microwave transmission window such that said microwave radiation surface makes a contact therewith, and
wherein a contact surface of said microwave radiation surface antenna and said microwave transmission window is sealed in a manner that a pressure thereof can be adjusted.

46. The plasma processing apparatus as claimed in claim 45, wherein said contact surface of said microwave radiation surface and said microwave transmission window is sealed by a seal element, and there is provided a pressure regulation valve in said processing chamber such that a pressure of said contact surface between said microwave radiation surface and said microwave transmission window is adjustable.

47. The plasma processing apparatus as claimed in claim 45, wherein thermally conductive gas is confined in said contact surface between said microwave radiation surface and said microwave transmission window.

48. The plasma processing apparatus as claimed in claim 47, wherein said thermally conductive gas is He.

49. The microwave plasma processing apparatus as claimed in claim 45, wherein said contact surface is maintained to a pressure lower than an atmospheric pressure.

50. The plasma processing apparatus as claimed in claim 49, wherein said contact surface is maintained to a pressure of 0.8–0.9 atm.

51. The microwave plasma processing apparatus as claimed in claim 45, further comprising a cooling part provided on said microwave antenna, said cooling part being provided on a surface of said microwave antenna opposing said microwave radiation surface.

52. The microwave plasma processing apparatus as claimed in claim 51, wherein said cooling part includes a cooling water passage.

53. The microwave plasma processing apparatus as claimed in claim 51, wherein said cooling part is formed of an air-cooling mechanism.

54. The plasma processing apparatus as claimed in claim 45, further comprising a high-frequency power source connected to said stage electrically.

55. A plasma processing apparatus, comprising:
a processing vessel defined by an outer wall and having a stage for holding a substrate to be processed;
an evacuation system coupled to said processing vessel;
a microwave transmission window provided on a part of said outer wall of said processing vessel so as to face said substrate on said stage;
a plasma gas inlet part introducing a plasma gas into said processing vessel;
a microwave antenna in intimate contact with said microwave transmission window at an outer side of said processing vessel;
a microwave power source coupled to said microwave antenna electrically;
a process gas supplying part disposed between said microwave transmission window and said substrate on said stage, said process gas supplying part forming an opening for causing plasma formed in the vicinity of the microwave transmission window to pass toward the substrate on said stage; and
a gap between a microwave radiation surface of said microwave antenna and said microwave transmission window is sealed by a seal element,
said gap being filled with a thermally conductive gas.

56. The plasma processing apparatus as claimed in claim 55, wherein said thermally conductive gas is formed of He.

57. The microwave plasma processing apparatus as claimed in claim 55, further comprising a cooling part provided on said microwave antenna, said cooling part being provided on an outer surface of said microwave antenna.

58. The plasma processing apparatus as claimed in claim 55, further comprising a high-frequency power source connected to said stage electrically.

* * * * *

UNITED STATES PATENT AND TRADEMARK OFFICE
CERTIFICATE OF CORRECTION

PATENT NO. : 7,097,735 B2 Page 1 of 1
APPLICATION NO. : 10/296614
DATED : August 29, 2006
INVENTOR(S) : Tadahiro Ohmi et al.

It is certified that error appears in the above-identified patent and that said Letters Patent is hereby corrected as shown below:

In claim 19, column 19, line 62, "said a contact" should read --said contact--.

In claim 23, column 20, line 10, "said second outer" should read --said outer--.

In claim 27, column 20, line 23, "$Al_2O_3$," should read --$Al_2O_3$,--.

In claim 45, column 22, line 38, "surface antenna" should read --surface between said microwave antenna--.

Signed and Sealed this

Fourth Day of December, 2007

JON W. DUDAS
*Director of the United States Patent and Trademark Office*